United States Patent
Yofu et al.

(10) Patent No.: US 8,686,408 B2
(45) Date of Patent: Apr. 1, 2014

(54) PHOTOELECTRIC CONVERSION DEVICE, IMAGING DEVICE AND PRODUCTION METHODS THEREOF

(75) Inventors: Katsuyuki Yofu, Kanagawa (JP); Daigo Sawaki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/581,083

(22) PCT Filed: Feb. 24, 2011

(86) PCT No.: PCT/JP2011/054838
§ 371 (c)(1),
(2), (4) Date: Aug. 24, 2012

(87) PCT Pub. No.: WO2011/105624
PCT Pub. Date: Sep. 1, 2011

(65) Prior Publication Data
US 2012/0313088 A1 Dec. 13, 2012

(30) Foreign Application Priority Data

Feb. 25, 2010 (JP) ................................. 2010-041126
Nov. 2, 2010 (JP) ................................. 2010-246871

(51) Int. Cl.
H01L 51/46 (2006.01)
(52) U.S. Cl.
USPC .... 257/40; 257/43; 257/E21.09; 257/E27.13; 257/E51.026; 438/63; 438/73; 438/82
(58) Field of Classification Search
None
See application file for complete search history.

(56) References Cited

U.S. PATENT DOCUMENTS

| | | |
|---|---|---|
| 6,471,929 B1 | 10/2002 | Kusunoki et al. |
| 6,793,967 B1 | 9/2004 | Ata et al. |
| 2002/0197477 A1 | 12/2002 | Ata et al. |
| 2003/0129436 A1 | 7/2003 | Ramm et al. |
| 2003/0207573 A1 | 11/2003 | Ramm et al. |
| 2005/0098204 A1* | 5/2005 | Roscheisen et al. .......... 136/263 |
| 2007/0205477 A1 | 9/2007 | Yokoyama |
| 2008/0035965 A1 | 2/2008 | Hayashi et al. |
| 2009/0050881 A1 | 2/2009 | Hayashi |
| 2009/0223566 A1 | 9/2009 | Mitsui et al. |
| 2010/0317767 A1 | 12/2010 | Tanaka et al. |
| 2011/0068254 A1 | 3/2011 | Hayashi |

FOREIGN PATENT DOCUMENTS

JP 1-034509 B2 7/1989

(Continued)

OTHER PUBLICATIONS

PCT/ISA/210 dated Jun. 14, 2011 in International Patent Application No. PCT/JP2011/054838.

(Continued)

*Primary Examiner* — Minh-Loan Tran
*Assistant Examiner* — Fazli Erdem
(74) *Attorney, Agent, or Firm* — Sughrue Mion, PLLC

(57) ABSTRACT

A photoelectric conversion device is provided and includes: a first electrode, a second electrode, and a photoelectric conversion layer between the first and second electrodes, the photoelectric conversion layer containing a mixture of an organic photoelectric conversion dye, a fullerene or a fullerene derivative, and a fullerene polymer; various embodiments of the device, a photosensor, an imaging device, and production methods for these devices.

19 Claims, 7 Drawing Sheets

(56) References Cited

FOREIGN PATENT DOCUMENTS

| | | |
|---|---|---|
| JP | 2001-007366 A | 1/2001 |
| JP | 2004-165609 A | 6/2004 |
| JP | 2005-158972 A | 6/2005 |
| JP | 2005-236278 A | 9/2005 |
| JP | 3986697 B2 | 7/2007 |
| JP | 2007-273945 A | 10/2007 |
| JP | 2008-072090 A | 3/2008 |
| JP | 2008-202029 A | 9/2008 |
| JP | 2009-049278 A | 3/2009 |
| JP | 2010-098034 A | 4/2010 |
| WO | 2008/081845 A1 | 7/2008 |

OTHER PUBLICATIONS

PCT/ISA/237 dated Jun. 14, 2011 in International Patent Application No. PCT/JP2011/054838.

Office Action dated May 8, 2012 in Japanese Patent Application No. 2010-246871.

Office Action dated Jun. 7, 2011 in Japanese Patent Application No. 2010-246871.

Office Action dated Nov. 29, 2011 in Japanese Patent Application No. 2010-246871.

Satoshi Watanabe, et al., "KPFM observation for Photo-assisted Formation of Donor-acceptor Spatial Distribution in Organic Photovoltaic Devices," Journal of Photopolymer Science and Technology, vol. 22, No. 5, 2009, pp. 571-574.

* cited by examiner

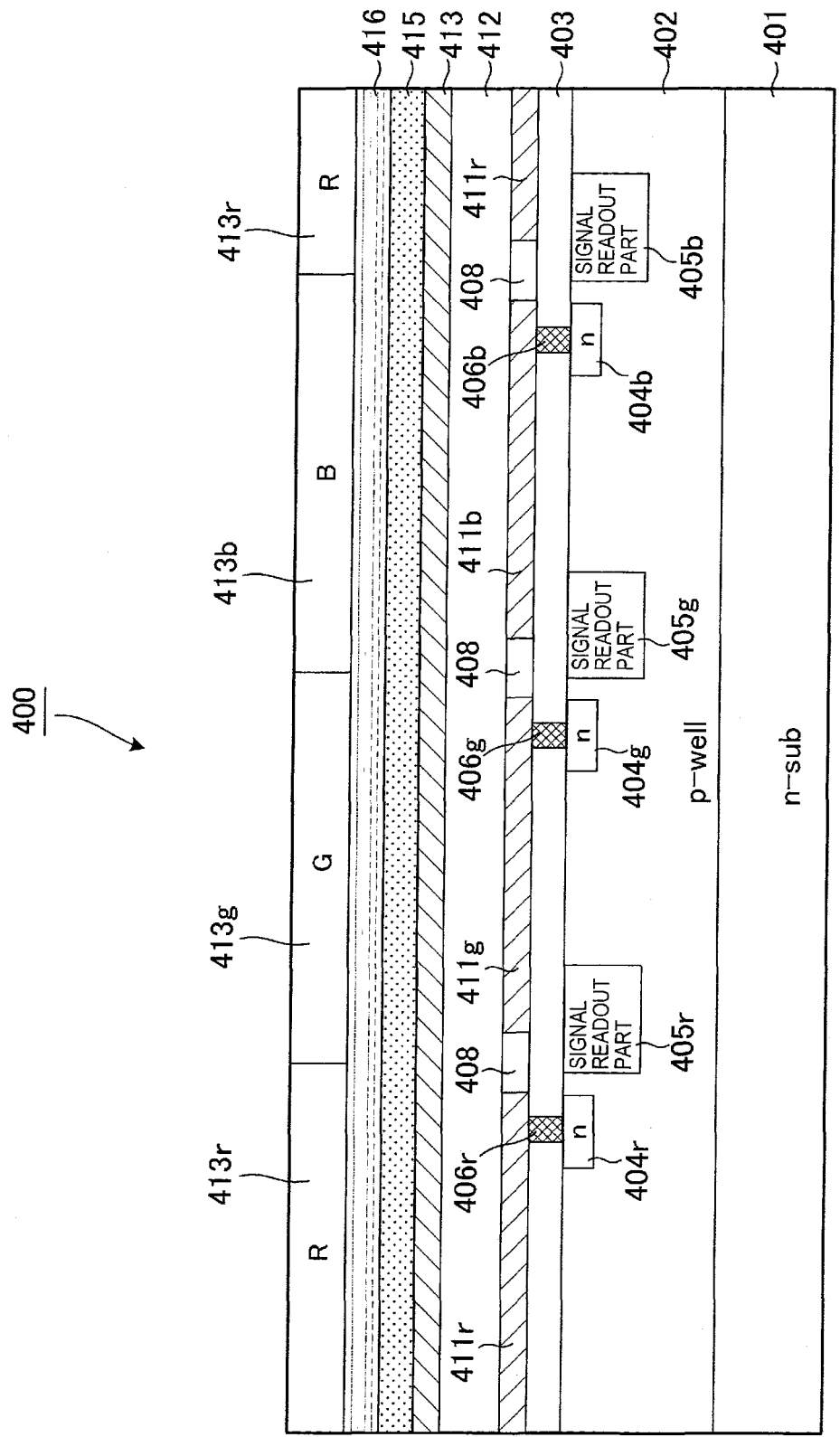

PHOTOELECTRIC CONVERSION DEVICE, IMAGING DEVICE AND PRODUCTION METHODS THEREOF

TECHNICAL FIELD

The present invention relates to a photoelectric conversion device used for solar cells and the like, an imaging device used as an image sensor, and production methods thereof. More specifically, the present invention relates to a photoelectric conversion device having, as an organic photoelectric conversion layer, a mixture of an organic photoelectric conversion dye and a fullerene, an imaging device, and production methods thereof.

BACKGROUND ART

A photoelectric conversion device having, as an organic photoelectric conversion layer, a mixture of an organic photoelectric conversion dye and a fullerene, described, for example, in JP-A-2001-7366 is attracting attention. A solar cell that receives sunlight and produces an electric energy is remarkably spreading as an apparatus for producing a clean energy replacing the petroleum energy, and above all, a solar cell having, as an organic photoelectric conversion layer, a mixture of an organic photoelectric conversion dye and a fullerene is highlighted thanks to its advantage that the photoelectric conversion efficiency is high.

However, such an organic photoelectric conversion layer has a problem that in the initial stage of receiving light irradiation, the photoelectric conversion efficiency is low.

In an imaging device for taking a subject image, individual pixels have a photoelectric conversion device, but the conventional imaging device called a CCD-type image sensor or a CMOS-type image sensor is approaching the limit of its production due to microfabrication and facing various problems. These problems are described below.

An image sensor (imaging device) in the related art mounted, for example, in a digital still camera, a digital video camera, a camera for cellular phones and a camera for endoscopes is configured such that pixels containing a photodiode as a photoelectric conversion device are formed and arranged in a two-dimensional array manner on a semiconductor substrate such as silicon chip and a signal charge corresponding to a photoelectron generated in the photodiode of each pixel is read to the outside through a CCD-type or CMOS-type signal readout circuit formed in the same semiconductor substrate.

As just described, in the image sensor in the related art, not only a photodiode as a photoelectric conversion device but also, for example, a signal readout circuit and a multilayer wiring associated therewith are formed together on a semiconductor substrate, and as the miniaturization of a pixel proceeds, the region occupied by the signal readout circuit or wiring in one pixel becomes relatively large, raising a problem of "reduction of aperture ratio", that is, the light-receiving area of the photodiode on one chip being relatively decreased.

The reduction of aperture ratio leads to reduction in sensitivity, and it becomes difficult to take a bright image or a low-noise image. To solve this problem, "a photoelectric conversion layer-stacked solid-state imaging device" where a signal readout circuit, wiring and the like are formed in a semiconductor substrate and a photoelectric conversion layer is stacked above the semiconductor substrate, thereby increasing the aperture ratio, has been proposed, for example, in JP-B-1-34509.

The photoelectric conversion layer-stacked solid-state imaging device is fabricated, for example, by forming and arranging a plurality of pixel electrode films in a two-dimensional array manner on a semiconductor substrate having formed therein a signal readout circuit and wiring, stacking a photoelectric conversion layer thereon as a monolithic configuration, and further forming a transparent opposite electrode film thereon as a monolithic configuration. In some cases, the opposite electrode film is disposed on the semiconductor substrate side and the pixel electrode film is disposed on the light entering side. In this case, the pixel electrode film is a transparent electrode film.

In such a photoelectric conversion layer-stacked solid-state imaging device, when a bias voltage is applied between the pixel electrode film and the opposite electrode film, an exciton generated in the photoelectric conversion layer by receiving incident light is dissociated into an electron and a hole, and a signal corresponding to an electron or hole charge migrated to the pixel electrode film in accordance with the bias voltage is output as a taken-in image signal to the outside of the imaging device through a CCD-type or CMOS-type signal readout circuit provided in the semiconductor substrate.

A conventional technique using an organic semiconductor for the photoelectric conversion layer is introduced, for example, in JP-A-2008-72090 and JP-A-2007-273945. The photoelectric conversion layer including an organic semiconductor has a large light absorption coefficient and enables formation as a thin film and thanks to little diffusion of an electric charge to the adjacent pixel, optical color mixing and electrical color mixing (cross-talk) can be reduced.

However, the photoelectric conversion device containing a P-type organic semiconductor and an N-type organic semiconductor described in JP-B-1-34509, JP-A-2008-72090, and JP-A-2007-273945 has a problem in view of durability, for example, the structure readily deteriorates, and there is room for improvement in the deterioration of sensitivity upon light irradiation.

On the other hand, in the conventional technique described in Japanese Patent No. 3,986,697, a structure formed by stacking a fullerene deposited film and a fullerene polymer film is used for the photoelectric conversion layer provided between a pixel electrode film and an opposite electrode film, and deterioration of the film structure due to unstable bonding attributable to intermolecular force of $C_{60}$ molecules of the fullerene deposited film is overcome by the fullerene polymer film.

According to this conventional technique, durability of the fullerene thin film is improved while utilizing its characteristics, and a photoelectric conversion device holding a room temperature operable performance and at the same time, being physically and chemically stable can be obtained.

However, in the conventional technique of Japanese Patent No. 3,986,697, the fullerene polymer film is used only for suppressing the deterioration of film structure of the fullerene deposited film, and there is a problem that a high photoelectric conversion efficiency cannot be obtained at the initial stage of operation of the photoelectric conversion device.

Furthermore, in the conventional technique of JP-A-2004-165609, the pn junction is created by using a fullerene molecule monomer-containing layer for the n-type semiconductor layer and a fullerene molecule polymer-containing layer for the p-type semiconductor layer, but this also has a problem that a high photoelectric conversion efficiency cannot be obtained at the initial stage of operation of the photoelectric conversion device.

SUMMARY OF INVENTION

An object of the present invention is to provide a practicable photoelectric conversion device having high durability and being capable of obtaining a high photoelectric conversion efficiency from the initial stage of operation and increasing the photoelectric conversion efficiency even when light irradiation proceeds, an imaging device, and production methods thereof.

(1)
A photoelectric conversion device comprising: a first electrode, a second electrode, and a photoelectric conversion layer between the first and second electrodes, the photoelectric conversion layer containing a mixture of an organic photoelectric conversion dye, a fullerene or a fullerene derivative, and a fullerene polymer.

(2)
The photoelectric conversion device as described in item (1), wherein the photoelectric conversion layer has a bulk-hetero structure containing the organic photoelectric conversion dye, the fullerene or a fullerene derivative, and the fullerene polymer.

(3)
The photoelectric conversion device as described in item (1) or (2), wherein the photoelectric conversion layer has a volume ratio of the fullerene polymer which is set to at least 10% by irradiating an electromagnetic wave or electron beam on the photoelectric conversion layer.

(4)
The photoelectric conversion device as described in item (3), wherein the electromagnetic wave or electron beam is a visible ray.

(5)
The photoelectric conversion device as described in item (4), wherein the visible ray has a wavelength of 400 to 700 nm.

(6)
The photoelectric conversion device as described in any one of items (1) to (5), wherein the fullerene polymer is contained in the photoelectric conversion layer in a volume ratio of 10 to 80%.

(7)
The photoelectric conversion device as described in any one of items (1) to (6), further comprising a charge blocking layer between the first or second electrode and the photoelectric conversion layer.

(8)
The photoelectric conversion device as described in item (7), wherein the charge blocking layer is an electron blocking layer.

(9)
The photoelectric conversion device as described in item (7), wherein the charge blocking layer is a hole blocking layer.

(10)
The photoelectric conversion device as described in any one of items (1) to (6), further comprising: an electron blocking layer between the first electrode and the photoelectric conversion layer; and a hole blocking layer between the second electrode and the photoelectric conversion layer.

(11)
The photoelectric conversion device as described in any one of items (1) to (10), wherein the organic photoelectric conversion dye is an arylidene compound.

(12)
The photoelectric conversion device as described in any one of items (1) to (11), wherein the organic photoelectric conversion dye is a compound represented by formula (I):

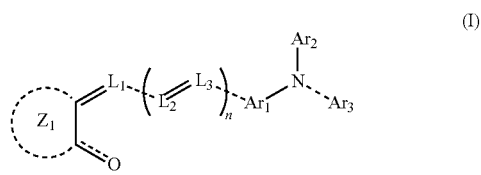

wherein $Z_1$ is a ring containing two carbon atoms and represents a 5-membered ring, a 6-membered ring, or a condensed ring containing at least one of a 5-membered ring and a 6-membered ring; $L_1$, $L_2$ and $L_3$ each independently represents an unsubstituted methine group or a substituted methine group; n represents an integer of 0 or more; $Ar_1$ represents a divalent group selected from the group consisting of a substituted arylene group, an unsubstituted arylene group, a substituted heteroarylene group, and an unsubstituted heteroarylene group; and $Ar_2$ and $Ar_3$ each independently represents a substituted aryl group, an unsubstituted aryl group, a substituted heteroaryl group or an unsubstituted heteroaryl group.

(13)
A photosensor comprising the photoelectric conversion device described in any one of items (1) to (12).

(14)
An imaging device comprising the photoelectric conversion device described in any one of items (1) to (12), wherein the first electrode comprises a pixel electrode film divided into individual pixels.

(15)
A method for producing the photoelectric conversion device described in any one of items (1) to (12), comprising irradiating a photoelectric conversion device containing a mixed layer of the organic photoelectric conversion dye and the fullerene or fullerene derivative with a visible ray to contain the fullerene polymer.

(16)
A method for producing the photosensor described in item (13), comprising irradiating a photoelectric conversion device containing a mixed layer of the organic photoelectric conversion dye and the fullerene or fullerene derivative with a visible ray to contain the fullerene polymer.

(17)
A method for producing the imaging device described in item (14), comprising irradiating a photoelectric conversion device containing a mixed layer of the organic photoelectric conversion dye and the fullerene or fullerene derivative with a visible ray to contain the fullerene polymer.

Advantageous Effects of Invention

According to an exemplary embodiment of the present invention, a fullerene polymer is previously formed in an organic photoelectric conversion layer, so that a high photoelectric conversion efficiency can be obtained from the initial stage of operation and moreover, the photoelectric conversion efficiency can be maintained high for a long period of time.

BRIEF DESCRIPTION OF THE DRAWINGS

FIG. 7 is a schematic cross-sectional view at the line X-X position of FIG. 6.

DESCRIPTION OF EMBODIMENTS

Figure 1A:
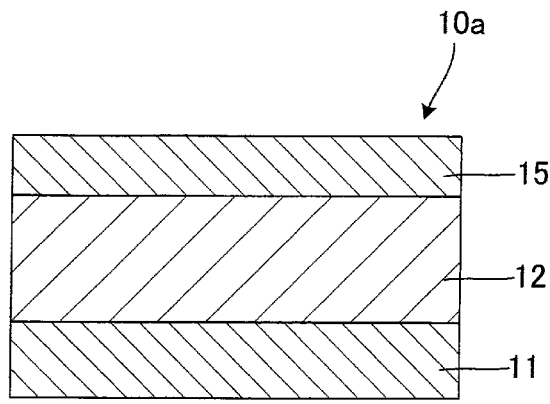
FIGS. 1A, 1B and 1C are schematic cross-sectional views of the photoelectric conversion devices according to first, second and third exemplary embodiments, respectively, of the present invention.

One aspect of the present invention is described below by referring to the drawings.

FIG. 1A is a schematic cross-sectional view of the photoelectric conversion device according to a first exemplary embodiment of the present invention, which is used in a solar cell and the like. The photoelectric conversion device 10a shown in FIG. 1A includes an electrically conductive film 11 working as the lower electrode, a transparent electrically conductive film 15 working as the upper electrode (the light entering side is defined as "upper"), and an organic photoelectric conversion layer (sometimes referred to as an "organic photoelectric conversion film" or a "photoelectric conversion layer") 12 formed between the upper electrode 15 and the lower electrode 11, and the lower electrode 11, the photoelectric conversion film 12 and the upper electrode 15 are stacked in this order.

As for the photoelectric conversion film 12, an organic photoelectric conversion dye and a fullerene (or a fullerene derivative) are co-deposited to form a bulk-heterostructure photoelectric conversion film where an organic photoelectric conversion dye and a fullerene (or a fullerene derivative) are mixed.

Furthermore, in this embodiment, before delivery as a product, the photoelectric conversion device is previously treated to form a fullerene polymer in the photoelectric conversion film 12 by adding light, heat, pressure or the like to the photoelectric conversion film 12, preferably by irradiating an electromagnetic wave including light or an electron beam, more preferably a visible ray, still more preferably a visible ray at a wavelength of 400 to 700 nm. That is, the photoelectric conversion film 12 of the photoelectric conversion device of this embodiment contains a mixture of an organic photoelectric conversion dye, a fullerene (or a fullerene derivative) and a fullerene polymer and is preferably formed as a bulk-heterostructure film.

As for the suitable electromagnetic wave, a visible ray at a wavelength of 400 to 700 nm is preferred from the standpoint of enabling polymerization of the fullerene and preventing breakage of the chemical bonding of the photoelectric conversion dye.

Figure 1B:
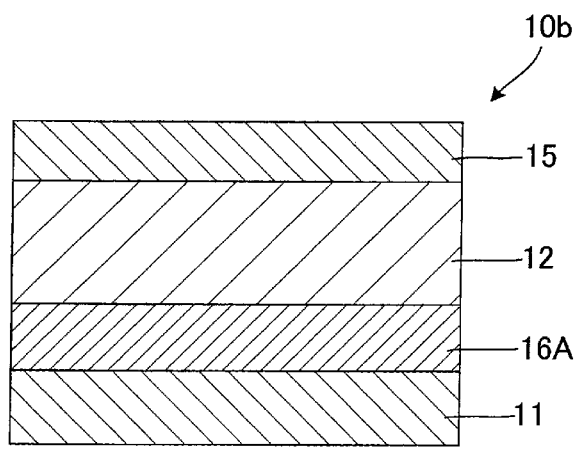

FIG. 1B is a schematic cross-sectional view of the photoelectric conversion device according to a second exemplary embodiment of the present invention. This photoelectric conversion device 10b has a configuration where an electron blocking layer 16A is added between the lower electrode 11 and the photoelectric conversion film 12 of the photoelectric conversion device 10a shown in FIG. 1A, and the lower electrode 11, the electron blocking layer 16A, the photoelectric conversion film 12 and the upper electrode 15 are stacked in this order.

Similarly to the first embodiment, the photoelectric conversion film 12 of the photoelectric conversion device 10b is also formed as a bulk-heterostructure film of an organic photoelectric conversion dye, a fullerene (or a fullerene derivative) and a fullerene polymer by co-depositing an organic photoelectric conversion dye and a fullerene (or a fullerene derivative).

In the photoelectric conversion device, it is preferred to provide an electron blocking layer between the first electrode and the photoelectric conversion layer and to provide a hole blocking layer between the second electrode and the photoelectric conversion layer.

Figure 1C:
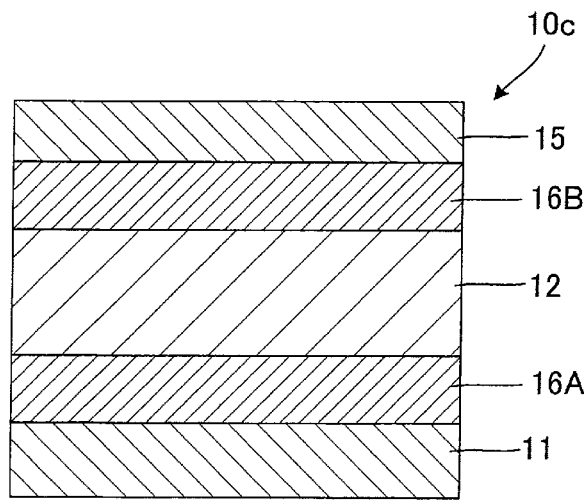

FIG. 1C is a schematic cross-sectional view of the photoelectric conversion device according to a third exemplary embodiment of the present invention, which is used in an imaging device. This photoelectric conversion device 10c has a configuration where a hole blocking layer 16B is added between the upper electrode 15 and the photoelectric conversion film 12 of the photoelectric conversion device 10b shown in FIG. 1B, and the lower electrode 11, the electron blocking layer 16A, the photoelectric conversion film 12, the hole blocking layer 16B and the upper electrode 15 are stacked in this order.

Similarly to the first and second embodiments, the photoelectric conversion film 12 of the photoelectric conversion device 10c is also formed as a bulk-heterostructure film of an organic photoelectric conversion dye, a fullerene (or a fullerene derivative) and a fullerene polymer by co-depositing an organic photoelectric conversion dye and a fullerene (or a fullerene derivative).

Incidentally, in the photoelectric conversion devices 10a, 10b and 10c, the order of stacking the lower electrode 11, the electron blocking layer 16A, the organic photoelectric conversion layer 12, the hole blocking layer 16B and the upper electrode 15 may be reversed according to the usage or characteristics of the photoelectric conversion device. In this case, the electrode (electrically conductive film) on the light transmitting side preferably includes a transparent material.

In using such a photoelectric conversion device, a voltage is preferably applied between the upper electrode 15 and the lower electrode 11 and, for example, an arbitrary electric field can be applied between the paired electrodes in a range of $1 \times 10^{-4}$ V/cm to $1 \times 10^{7}$ V/cm.

The constituent materials of the photoelectric conversion devices 10a, 10b and 10c are described below.

(Electrode)

The upper electrode (transparent electrically conductive film) 15 and the lower electrode (electrically conductive film) 11 include an electrically conductive material. As for the electrically conductive material, a metal, an alloy, a metal oxide, an electric conducting compound or a mixture thereof may be used.

The light enters the upper electrode 15 and therefore, the upper electrode 15 must be sufficiently transparent to light to be detected. Examples thereof include an electrically conductive metal oxide such as tin oxide doped with antimony, fluorine or the like (ATO, FTO), tin oxide, zinc oxide, indium oxide, indium tin oxide (ITO) and zinc indium oxide (IZO), a thin metal film such as gold, silver, chromium and nickel, a mixture or layer product of such a metal and an electrically conductive metal oxide, an inorganic electrically conductive material such as copper iodide and copper sulfide, an organic electrically conductive material such as polyaniline, polythiophene and polypyrrole, and a layer product of such a material and ITO.

Among these, in view of high electrical conductivity, transparency and the like, an electrically conductive metal oxide is preferred. The film of the upper electrode 15 is deposited on the organic photoelectric conversion layer 12 and therefore, the film is preferably deposited by a method involving no deterioration in the properties of the organic photoelectric conversion layer 12. Also, the upper electrode 15 preferably includes a transparent electrically conductive oxide.

The lower electrode 11 includes, according to the usage, for example, a case where transparency is imparted and a case where transparency is not imparted and a material capable of reflecting light is used. Specific examples thereof include an electrically conductive metal oxide such as tin oxide doped with antimony, fluorine or the like (ATO, FTO), tin oxide, zinc oxide, indium oxide, indium tin oxide (ITO) and zinc indium oxide (IZO), a metal such as gold, silver, chromium, nickel, titanium, tungsten and aluminum, an electrically conductive compound such as oxide or nitride of the metal above (for example, titanium nitride (TiN)), a mixture or a layer product of such a metal and an electrically conductive metal oxide, an inorganic electrically conductive material such as copper iodide and copper sulfide, an organic electrically conductive material such as polyaniline, polythiophene and polypyrrole, and a layer product of such a material and ITO or titanium nitride.

The method for forming the electrode is not particularly limited and may be appropriately selected by taking into consideration the suitability for the electrode material. Specifically, the electrode can be formed, for example, by a wet system such as printing and coating, a physical system such as vacuum deposition, sputtering and ion plating, or a chemical system such as CVD and plasma CVD.

In the case where the electrode material is ITO, the electrode can be formed, for example, by an electron beam method, a sputtering method, a resistance heating deposition method, a chemical reaction method (e.g., sol-gel process), or a method of coating a dispersion of indium tin oxide. Furthermore, a UV-ozone treatment, a plasma treatment or the like can be applied to the film produced using ITO. In the case where the electrode material is TiN, various methods including a reactive sputtering method can be used, and a UV-ozone treatment, a plasma treatment or the like can further be applied.

The upper electrode 15 is preferably produced in a plasma-free state. By producing the upper electrode 15 in a plasma-free state, the effect of a plasma on the substrate can be reduced, and good photoelectric conversion properties can be obtained. Here, the term "plasma-free state" means a state where a plasma is not generated during film deposition of the upper electrode 15 or where the distance from the plasma generation source to the substrate on which the electrode film is deposited is 2 cm or more, preferably 10 cm or more, more preferably 20 cm or more, and the amount of plasma reaching the substrate is reduced.

Examples of the apparatus where plasma is not generated during film deposition of the upper electrode 15 include an electron beam deposition apparatus (EB deposition apparatus) and a pulsed laser deposition apparatus. As for the EB deposition apparatus and pulsed laser deposition apparatus, there may be used an apparatus described, for example, in Yutaka Sawada (supervisor), Toumei Doden Maku no Shin Tenkai (New Development of Transparent Electrically Conductive Film), CMC (1999), Yutaka Sawada (supervisor), Toumei Doden Maku no Shin Tenkai II (New Development II of Transparent Electrically Conductive Film), CMC (2002), Toumei Doden Maku no Gijutsu (Technology of Transparent Electrically Conductive Film), JSPS, Ohm-sha (1999), and references and the like recited therein.

In the following, the method of depositing the transparent electrode film by using an EB deposition apparatus is referred to as an "EB deposition method", and the method of depositing the transparent electrode film by using a pulsed laser deposition apparatus is referred to as a "pulsed laser deposition method".

In the case where a transparent electrically conductive film such as TCO is used for the upper electrode 15, an increase of DC short or leak current is sometimes brought about. One of causes thereof is considered because fine cracks introduced into the photoelectric conversion layer 12 are covered by a dense film such as TCO, and conduction with the electrode 11 on the opposite side increases. Therefore, in the case of an electrode having relatively poor film quality such as aluminum, an increase of leak current less occurs. The increase of leak current can be greatly suppressed by controlling the film thickness of the upper electrode 15 with respect to the film thickness (that is, the crack depth) of the photoelectric conversion layer 12. The thickness of the upper electrode 15 is preferably ⅕ or less, more preferably 1/10 or less, of the thickness of the photoelectric conversion layer 12.

Usually, when the thickness of the electrically conductive film is made smaller than a certain range, an abrupt increase of the resistance value is incurred, but in the solid-state imaging device having incorporated therein the photoelectric conversion device according to this embodiment, the sheet resistance may be preferably from 100 to 10,000 Ω/sq. and the latitude as to in which range the film thickness can be reduced is large.

Also, as the thickness of the upper electrode (transparent electrically conductive film) 15 is smaller, the quantity of light absorbed becomes smaller and the light transmittance generally increases. The increase of light transmittance yields an increase of light absorption in the photoelectric conversion layer 12 and an increase of photoelectric conversion performance, and this is very preferred. Considering the suppression of leak current associated with reduction in the film thickness as well as the increase in the resistance value of thin film and the increase of light transmittance, the film thickness of the upper electrode 15 is preferably from 5 to 100 nm, more preferably from 5 to 20 nm.

(Organic Photoelectric Conversion Dye)

The organic photoelectric conversion dye is a compound whose HOMO level is shallower than the HOMO level of fullerene and LUMO level is shallower than the LUMO level of fullerene, and the compound may be sufficient if it is a dye (dyestuff or pigment) having absorption peak in the visible region (wavelength: from 400 to 700 nm). Examples thereof include an arylidene compound, a merocyanine compound, a squarylium compound, a coumarin compound, an azo-based compound, a porphyrin compound, a quinacridone compound, an anthraquinone compound, a phthalocyanine compound, an indigo compound and a diketopyrolopyrrole compound, with an arylidene compound being preferred.

The organic photoelectric conversion dye is preferably a compound represented by the following formula (I):

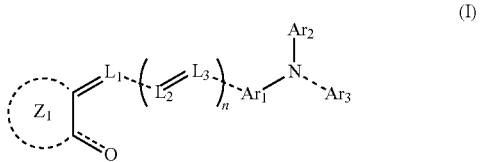

(I)

wherein $Z_1$ is a ring containing two carbon atoms and represents a 5-membered ring, a 6-membered ring, or a condensed ring containing at least one of a 5-membered ring and a 6-membered ring; $L_1$, $L_2$ and $L_3$ each independently represents an unsubstituted methine group or a substituted methine group; n represents an integer of 0 or more; $Ar_1$ represents a divalent group selected from the group consisting of a substituted arylene group, an unsubstituted arylene group, a substituted heteroarylene group, and an unsubstituted heteroarylene group; and $Ar_2$ and $Ar_3$ each independently represents a substituted aryl group, an unsubstituted aryl group, a substituted heteroaryl group or an unsubstituted heteroaryl group.

The 5-membered ring, 6-membered ring or condensed ring containing at least one of a 5-membered ring and a 6-membered ring, represented by $Z_1$, is preferably a ring usually used as an acidic nucleus of a merocyanine dye, and specific examples thereof include the followings:

(a) a 1,3-dicarbonyl nucleus such as 1,3-indanedione nucleus, 1,3-cyclohexanedione, 5,5-dimethyl-1,3-cyclohexanedione and 1,3-dioxane-4,6-dione, (b) a pyrazolinone nucleus such as 1-phenyl-2-pyrazolin-5-one, 3-methyl-1-phenyl-2-pyrazolin-5-one and 1-(2-benzothiazoyl)-3-methyl-2-pyrazolin-5-one, (c) an isoxazolinone nucleus such as 3-phenyl-2-isoxazolin-5-one and 3-methyl-2-isoxazolin-5-one, (d) an oxyindole nucleus such as 1-alkyl-2,3-dihydro-2-oxyindole, (e) a 2,4,6-triketohexahydropyrimidine nucleus such as barbituric acid, 2-thiobarbituric acid and a derivative thereof, where examples of the derivative include a 1-alkyl form such as 1-methyl and 1-ethyl, a 1,3-dialkyl form such as 1,3-dimethyl, 1,3-diethyl and 1,3-dibutyl, a 1,3-diaryl form such as 1,3-diphenyl, 1,3-di(p-chlorophenyl) and 1,3-di(p-ethoxycarbonylphenyl), a 1-alkyl-1-aryl form such as 1-ethyl-3-phenyl, and a 1,3-diheterocyclic ring substitution form such as 1,3-di(2-pyridyl), (f) a 2-thio-2,4-thiazolidinedione nucleus such as rhodanine and a derivative thereof, where examples of the derivative include a 3-alkylrhodanine such as 3-methylrhodanine, 3-ethylrhodanine and 3-allylrhodanine, a 3-arylrhodanine such as 3-phenylrhodanine, and a 3-heterocyclic ring-substituted rhodanine such as 3-(2-pyridyl)rhodanine, (g) a 2-thio-2,4-oxazolidinedione (2-thio-2,4-(3H,5H)-oxazoledione) nucleus such as 3-ethyl-2-thio-2,4-oxazolidinedione, (h) a thianaphthenone nucleus such as 3(2H)-thianaphthenone-1,1-dioxide, (i) a 2-thio-2,5-thiazolidinedione nucleus such as 3-ethyl-2-thio-2,5-thiazolidinedione, (j) a 2,4-thiazolidinedione nucleus such as 2,4-thiazolidinedione, 3-ethyl-2,4-thiazolidinedione and 3-phenyl-2,4-thiazolidinedione, (k) a thiazolin-4-one nucleus such as 4-thiazolinone and 2-ethyl-4-thiazolinone, (l) a 2,4-imidazolidinedione (hydantoin) nucleus such as 2,4-imidazolidinedione and 3-ethyl-2,4-imidazolidinedione, (m) a 2-thio-2,4-imidazolidinedione (2-thiohydantoin) nucleus such as 2-thio-2,4-imidazolidinedione and 3-ethyl-2-thio-2,4-imidazolidinedione, (n) an imidazolin-5-one nucleus such as 2-propylmercapto-2-imidazolin-5-one, (o) a 3,5-pyrazolidinedione nucleus such as 1,2-diphenyl-3,5-pyrazolidinedione and 1,2-dimethyl-3,5-pyrazolidinedione, (p) a benzothiophen-3-one nucleus such as benzothiophen-3-one, oxobenzothiophen-3-one and dioxobenzothiophen-3-one, and (q) an indanone nucleus such as 1-indanone, 3-phenyl-1-indanone, 3-methyl-1-indanone, 3,3-diphenyl-1-indanone and 3,3-dimethyl-1-indanone.

The ring formed by $Z_1$ is preferably a 1,3-dicarbonyl nucleus, a pyrazolinone nucleus, a 2,4,6-triketohexahydropyrimidine nucleus (including a thioketone form, e.g., barbituric acid nucleus, 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus, more preferably a 1,3-dicarbonyl nucleus, a 2,4,6-triketohexahydropyrimidine nucleus (including a thioketone form, e.g., barbituric acid nucleus, 2-thiobarbituric acid nucleus), a 3,5-pyrazolidinedione nucleus, a benzothiophen-3-one nucleus or an indanone nucleus, still more preferably a 1,3-dicarbonyl nucleus or a 2,4,6-triketohexahydropyrimidine nucleus (including a thioketone form, e.g., barbituric acid nucleus, 2-thiobarbituric acid nucleus), yet still more preferably a 1,3-indanedione nucleus, a barbituric acid nucleus, a 2-thiobarbituric acid nucleus or a derivative thereof.

Each of $L_1$, $L_2$ and $L_3$ independently represents an unsubstituted methine group or a substituted methine group. Substituted methine groups may combine with each other to form a ring (for example, a 6-membered ring such as benzene ring). Examples of the substituent of the substituted methine group include the substituent W, and it is preferred that $L_1$, $L_2$ and $L_3$ all are an unsubstituted methine group.

$L_1$ to $L_3$ may combine with each other to form a ring, and preferred examples of the ring formed include a cyclohexene ring, a cyclopentene ring, a benzene ring, a naphthalene ring, a thiophene ring and a pyran ring.

n represents an integer of 0 or more, preferably represents an integer of 0 to 3, and is more preferably 0. When n becomes large, the absorption wavelength region is allowed to reside on a long wavelength side, but the thermal decomposition temperature is lowered. From the standpoint of having appropriate absorption in the visible region and suppressing thermal decomposition at the film deposition, n is preferably 0.

The arylene group represented by $Ar_1$ is preferably an arylene group having a carbon number of 6 to 30, more preferably an arylene group having a carbon number of 6 to 18. The arylene group may have the later-described substituent W and is preferably an arylene group having a carbon number of 6 to 18, which may have an alkyl group having a carbon number of 1 to 4. Examples thereof include a phenylene group, a naphthylene group, an anthracenylene group, a pyrenylene group, a phenanthrenylene group, a methylphenylene group and a dimethylphenylene group, with a phenylene group and a naphthylene group being preferred.

The heteroarylene group represented by $Ar_1$ is preferably a heteroarylene group having a carbon number of 3 to 30, more preferably a carbon number of 4 to 18. The heteroarylene group may have the later-described substituent W and is preferably an arylene group having a carbon number of 4 to 18, which may have an alkyl group having a carbon number of 1 to 4. Preferred heteroarylene structures include thiophene, furan, pyrrole, oxazole, diazole, thiazole, and their benzo-condensed ring derivatives and thieno-condensed ring derivatives, and thiophene, benzothiophene, thienothiophene, dibenzothiophene and bithienothiophene are more preferred.

Each of the aryl groups represented by $Ar_2$ and $Ar_3$ is independently, preferably an aryl group having a carbon number of 6 to 30, more preferably an aryl group having a carbon number of 6 to 18. The aryl group may have a substituent and is preferably an aryl group having a carbon number of 6 to 18, which may have an alkyl group having a carbon number of 1 to 4 or an aryl group having a carbon number of 6 to 18. Examples thereof include a phenyl group, a naphthyl group, an anthracenyl group, a pyrenyl group, a phenanthrenyl group, a methylphenyl group, a dimethylphenyl group and a biphenyl group, and a phenyl group, a naphthyl group and an anthracenyl group are preferred.

Each of the heterocyclic groups represented by $Ar_2$ and $Ar_3$ is independently, preferably a heterocyclic group having a carbon number of 3 to 30, more preferably a heterocyclic group having a carbon number of 3 to 18. The heterocyclic group may have a substituent and is preferably a heterocyclic group having a carbon number of 3 to 18, which may have an alkyl group having a carbon number of 1 to 4 or an aryl group having a carbon number of 6 to 18. Also, the heterocyclic group represented by $R^a$ and $R^b$ is preferably a condensed ring structure, and a condensed ring structure including a combination of rings (the rings may be the same ring) selected from a furan ring, a thiophene ring, a selenophene ring, a silole ring, a pyridine ring, a pyrazine ring, a pyrimidine ring, an oxazole ring, a thiazole ring, a triazole ring, an oxadiazole ring and a thiadiazole ring is preferred. The heterocyclic group is preferably a quinoline ring, an isoquinoline ring, a benzothiophene ring, a dibenzothiophene ring, a thienothiophene ring, a bithienobenzene ring or a bithienothiophene ring.

The arylene group and aryl group represented by $Ar_1$, $Ar_2$ and $Ar_3$ are preferably a condensed ring structure, more preferably a condensed ring structure containing a benzene ring, still more preferably a naphthalene ring, an anthracene ring, a pyrene ring or a phenanthrene ring, yet still more preferably a naphthalene ring or an anthracene ring.

The substituent W includes a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may also be referred to as a heteroring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyl group, an aryloxycarbonyl group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H) and other known substituents.

In the case where the substituent in $Ar_2$ and $Ar_3$ is an aliphatic hydrocarbon group (preferably an alkyl group or an alkenyl group), the substituent may form a ring (preferably a 6-membered ring) by combining with a hydrogen atom or a substituent on the aromatic ring (preferably a benzene ring) structure of the aryl group on which $Ar_1$ is substituted.

The substituents in $Ar_2$ and $Ar_3$ may combine with each other to form a ring (preferably a 5- or 6-membered ring, more preferably a 6-membered ring), or each of $Ar_2$ and $Ar_3$ may combine with a substituent in L (indicates any one of $L_1$, $L_2$ and $L_3$) to form a ring (preferably a 5- or 6-membered ring, more preferably a 6-membered ring).

The compound represented by formula (I) is a compound described in JP-A-2000-297068, and compounds undisclosed in this patent publication can also be produced in accordance with the synthesis method described in the patent publication.

Specific preferred examples of the compound represented by formula (I) are illustrated below by using formula (II), but the present invention is not limited thereto.

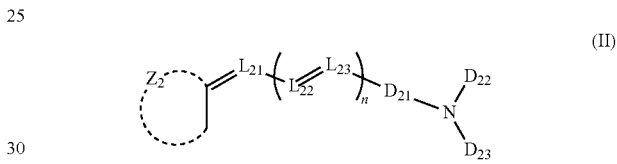

(II)

In formula (II), $Z_2$ represents any one of A-1 to A-12 in Table 1, $L_{21}$ represents methylene, n represents 0, $D_{21}$ represents any one of B-1 to B-9, and each of $D_{22}$ and $D_{23}$ represents any one of C-1 to C-16. $Z_2$ is preferably A-1 or A-2, each of $D_{22}$ and $D_{23}$ is preferably any one selected from C-1, C-2, C-15 and C-16, and $D_{21}$ is preferably B-1 or B-9.

TABLE 1

(In Table, "*" indicates the bonding position.)

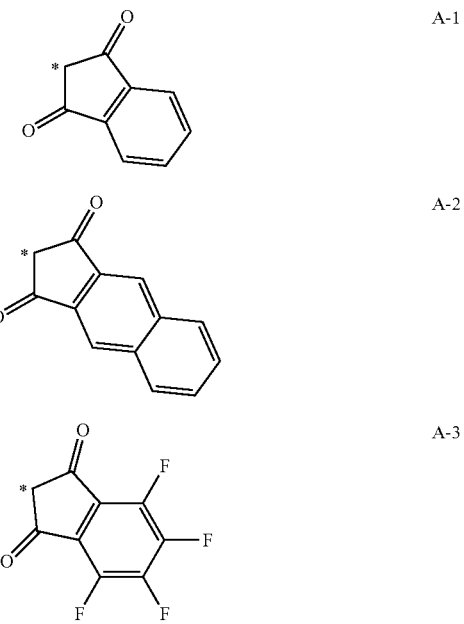

TABLE 1-continued
(In Table, "*" indicates the bonding position.)
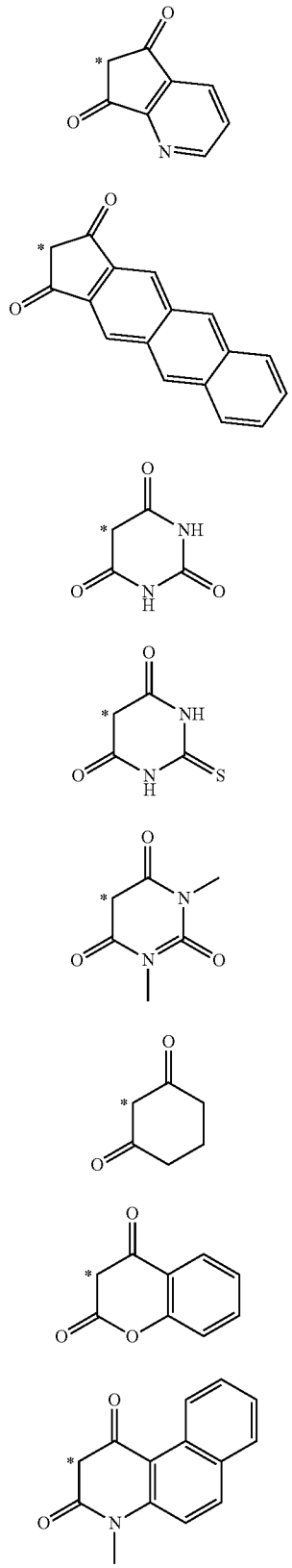
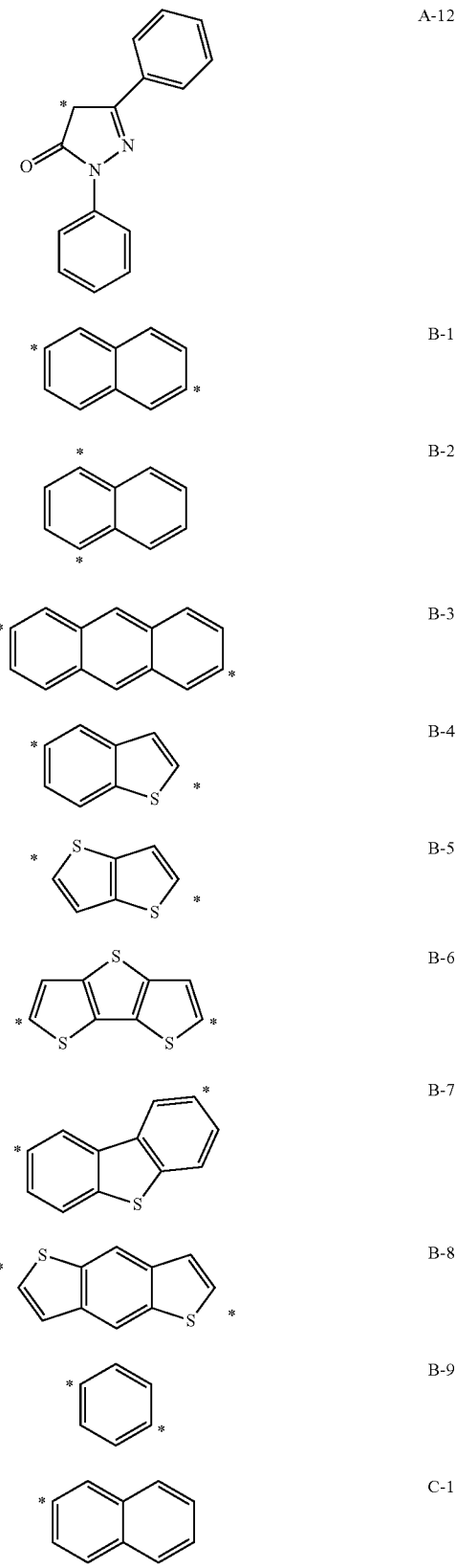

TABLE 1-continued (In Table, "*" indicates the bonding position.)

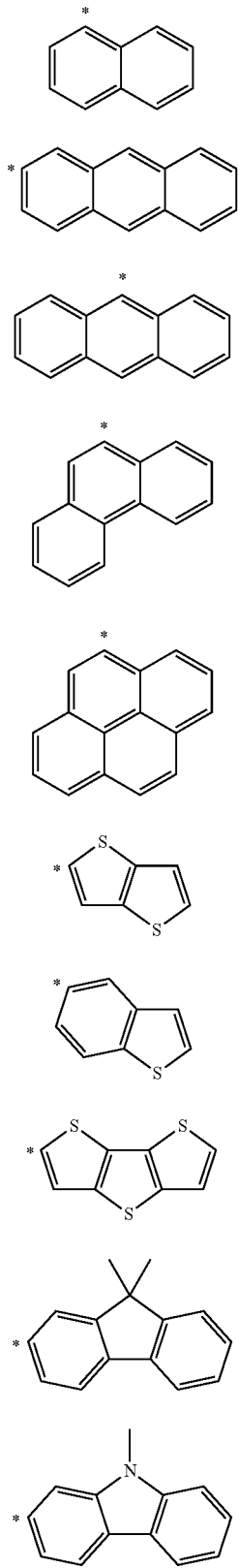

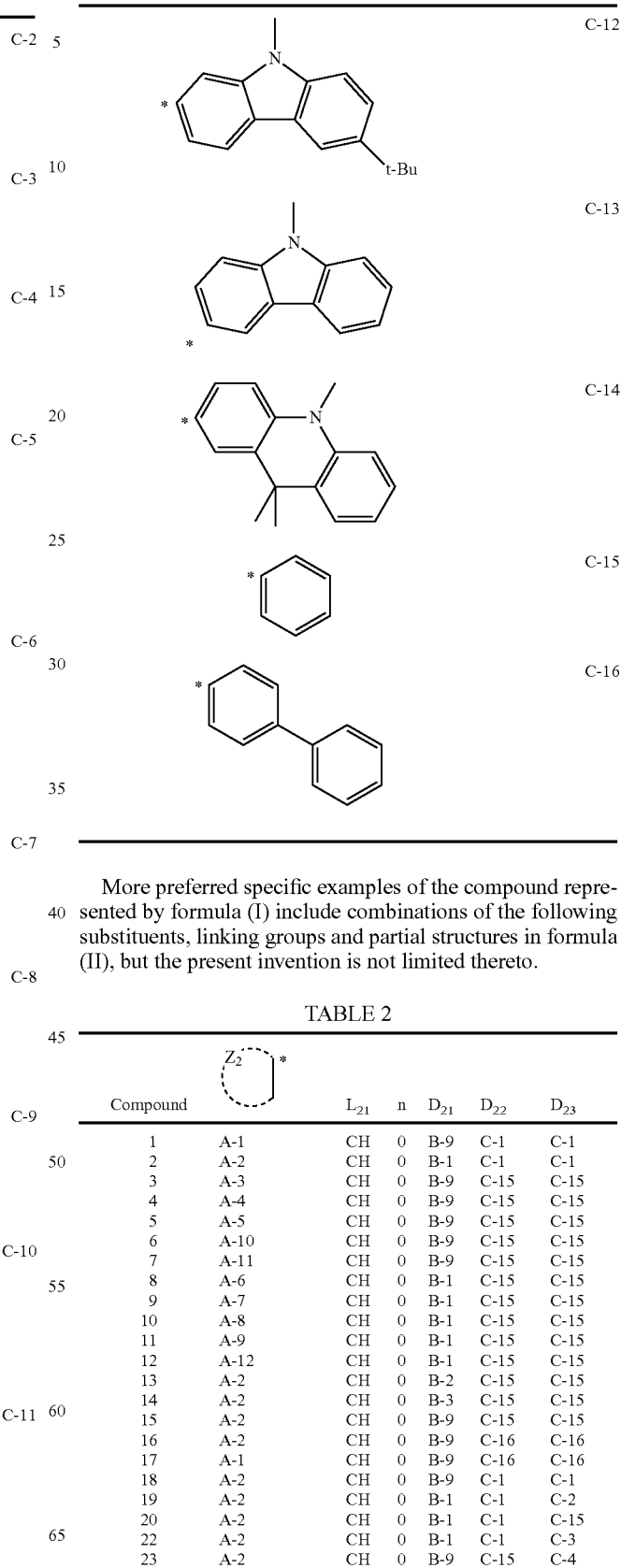

More preferred specific examples of the compound represented by formula (I) include combinations of the following substituents, linking groups and partial structures in formula (II), but the present invention is not limited thereto.

TABLE 2

| Compound | | $L_{21}$ | n | $D_{21}$ | $D_{22}$ | $D_{23}$ |
|---|---|---|---|---|---|---|
| 1 | A-1 | CH | 0 | B-9 | C-1 | C-1 |
| 2 | A-2 | CH | 0 | B-1 | C-1 | C-1 |
| 3 | A-3 | CH | 0 | B-9 | C-15 | C-15 |
| 4 | A-4 | CH | 0 | B-9 | C-15 | C-15 |
| 5 | A-5 | CH | 0 | B-9 | C-15 | C-15 |
| 6 | A-10 | CH | 0 | B-9 | C-15 | C-15 |
| 7 | A-11 | CH | 0 | B-9 | C-15 | C-15 |
| 8 | A-6 | CH | 0 | B-1 | C-15 | C-15 |
| 9 | A-7 | CH | 0 | B-1 | C-15 | C-15 |
| 10 | A-8 | CH | 0 | B-1 | C-15 | C-15 |
| 11 | A-9 | CH | 0 | B-1 | C-15 | C-15 |
| 12 | A-12 | CH | 0 | B-1 | C-15 | C-15 |
| 13 | A-2 | CH | 0 | B-2 | C-15 | C-15 |
| 14 | A-2 | CH | 0 | B-3 | C-15 | C-15 |
| 15 | A-2 | CH | 0 | B-9 | C-15 | C-15 |
| 16 | A-2 | CH | 0 | B-9 | C-16 | C-16 |
| 17 | A-1 | CH | 0 | B-9 | C-16 | C-16 |
| 18 | A-2 | CH | 0 | B-9 | C-1 | C-1 |
| 19 | A-2 | CH | 0 | B-1 | C-1 | C-2 |
| 20 | A-2 | CH | 0 | B-1 | C-1 | C-15 |
| 22 | A-2 | CH | 0 | B-1 | C-1 | C-3 |
| 23 | A-2 | CH | 0 | B-9 | C-15 | C-4 |

TABLE 2-continued

| Compound | $Z_2$ | $L_{21}$ | n | $D_{21}$ | $D_{22}$ | $D_{23}$ |
|---|---|---|---|---|---|---|
| 24 | A-2 | CH | 0 | B-9 | C-15 | C-5 |
| 25 | A-2 | CH | 0 | B-9 | C-15 | C-6 |
| 26 | A-2 | CH | 0 | B-9 | C-7 | C-7 |
| 27 | A-2 | CH | 0 | B-9 | C-8 | C-8 |
| 28 | A-2 | CH | 0 | B-1 | C-10 | C-10 |
| 29 | A-2 | CH | 0 | B-9 | C-11 | C-11 |
| 30 | A-2 | CH | 0 | B-9 | C-12 | C-12 |
| 31 | A-2 | CH | 0 | B-4 | C-15 | C-15 |
| 32 | A-2 | CH | 0 | B-5 | C-15 | C-15 |
| 33 | A-2 | CH | 0 | B-6 | C-15 | C-15 |
| 34 | A-2 | CH | 0 | B-7 | C-15 | C-15 |
| 35 | A-2 | CH | 0 | B-8 | C-15 | C-15 |

In Table 2, A-1 to A-12, B-1 to B-9 and C-1 to C-16 have the same meanings as those shown in Table 1.

As the organic photoelectric conversion dye, for example, the following compounds 121 to 123 are also preferred.

121

122
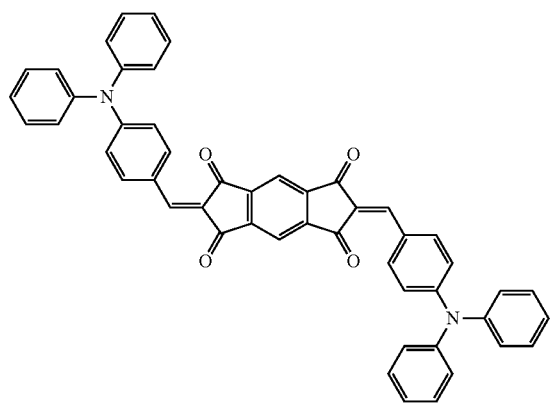

123
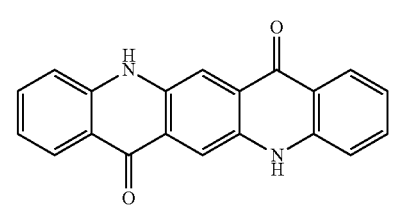

(Fullerene)

The fullerene indicates fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, a mixed fullerene or a fullerene nanotube.

(Fullerene Derivative)

The fullerene derivative indicates a compound resulting from addition of a substituent to the fullerene above. The substituent is preferably an alkyl group, an aryl group or a heterocyclic group. As for the fullerene derivative, a compound represented by the following formula described, for example, in JP-A-2007-123707 is preferably used.

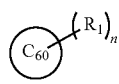

In the formula of above, $R_1$ represents a substituent. The substituent is preferably an alkyl group, an aryl group or a heterocyclic group. The alkyl group is more preferably an alkyl group having a carbon number of 1 to 12, and the aryl group and heterocyclic group are preferably a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring or a phenazine ring, more preferably a benzene ring, a naphthalene ring, an anthracene ring, a phenanthrene ring, a pyridine ring, an imidazole ring, an oxazole ring or a thiazole ring, still more preferably a benzene ring, a naphthalene ring or a pyridine ring. These may further have a substituent and, if possible, the substituents may combine to form a ring. Incidentally, when n is 2 or more, the plurality of $R_1$'s may be the same or different. Also, if possible, the plurality of $R_1$'s may combine to form a ring. n represents an integer of 1 to 60 and is preferably an integer of 1 to 10.

As for the fullerene and fullerene derivative, the compounds described, for example, in Kikan Kagaku Sosetsu (Scientific Review Quarterly), No. 43, edited by The Chemical Society of Japan (1999), JP-A-10-167994, JP-A-11-255508, JP-A-11-255509, JP-A-2002-241323 and JP-A-2003-196881 may also be used. Among fullerenes and fullerene derivatives, a fullerene is preferred, and fullerene $C_{60}$ is more preferred.

(Fullerene Polymer)

The fullerene polymer is a compound obtained by polymerizing a plurality of fullerene molecules through covalent bonding and is known to be synthesized using light, heat, pressure or the like (see, for example, Science, 1993, 256, 955, and Nature, 1992, 359, 44). Above all, the compound is preferably polymerized using light in view of production aptitude.

In the present invention, the fullerene polymer can be obtained by irradiating a mixed layer of the above-described organic photoelectric conversion dye and the fullerene or fullerene derivative with an electromagnetic wave or an electron beam and can be contained in the mixed layer (photoelectric conversion layer).

The photoelectric conversion device is preferably a photoelectric conversion device where the volume ratio of the fullerene polymer is adjusted to at least 10% or more in the photoelectric conversion layer by the irradiation of an electromagnetic wave or an electron beam on the photoelectric conversion layer.

The fullerene polymer is preferably contained in the photoelectric conversion layer in a volume ratio of 10 to 80%, more preferably from 20 to 70%. Within this range, a photoelectric conversion device having high external quantum efficiency and high light responsivity can be fabricated. The content of the fullerene polymer in the photoelectric conversion layer can be adjusted to the desired range by controlling the content of the fullerene or fullerene derivative in the photoelectric conversion layer.

(Organic Photoelectric Conversion Layer)

The organic photoelectric conversion layer 12 is preferably a bulk-heterostructure layer formed in a state of those organic photoelectric conversion layer, fullerene (or fullerene derivative) and fullerene polymer being mixed. When a heterojunction structure is contained, this enables compensating for the drawback that the carrier diffusion length in the photoelectric conversion layer is short, and enhancing the photoelectric conversion efficiency of the photoelectric conversion layer.

The volume ratio of the fullerene polymer (volume ratio=fullerene polymer/(organic photoelectric conversion dye+fullerene monomer+fullerene polymer))×100%) is preferably from 10 to 80%, more preferably from 20 to 70%.

The film of the photoelectric conversion layer can be deposited by a dry film deposition method or a wet film deposition method. Specific examples of the dry film deposition method include a physical vapor-growth method such as vacuum deposition, sputtering, ion plating and MBE, and a CVD method such as plasma polymerization. As for the wet film deposition method, a casting method, a spin-coating method, a dipping method, an LB method and the like are be used. A dry film deposition method is preferred, and a vacuum deposition method is more preferred. In the case of depositing the film by a vacuum deposition method, the production conditions such as vacuum degree and deposition temperature can be set in a conventional manner.

In the case of forming the organic photoelectric conversion layer by the vapor deposition method, the decomposition temperature is preferably higher than the temperature allowing for vapor deposition, because thermal decomposition during vapor deposition can be suppressed. The coating method is advantageous in that the layer can be formed without limitation by the decomposition above and a low cost can be realized, but the layer is preferably formed by vapor deposition method because uniform layer formation is facilitated and the possibility of impurity mixing can be reduced.

The thickness of the photoelectric conversion layer is preferably from 10 to 1,000 nm, more preferably from 50 to 800 nm, still more preferably from 100 to 500 nm. With a thickness of 10 nm or more, a suitable effect of suppressing dark current is obtained, and with a thickness of 1,000 nm or less, a suitable photoelectric conversion efficiency is obtained.

(Charge Blocking Layer)

The charge blocking layer includes an electron blocking layer of inhibiting injection of an electron and transporting a hole, and a hole blocking layer of inhibiting injection of a hole and transporting an electron.

The photoelectric conversion device preferably has a charge blocking layer between the first electrode or the second electrode and the photoelectric conversion layer.

The thickness of the electron blocking layer and hole blocking layer is preferably from 10 to 200 nm, more preferably from 30 to 150 nm, still more preferably from 50 to 100 nm, because if this thickness is too small, the effect of suppressing dark current is decreased, whereas if it is excessively large, the photoelectric conversion efficiency is reduced.

(Electron Blocking Layer)

The charge blocking layer may be an electron blocking layer.

For the electron blocking layer, an electron-donating organic material can be used. Specifically, examples of the low molecular material which can be used include an aromatic diamine compound such as N,N'-bis(3-methylphenyl)-(1,1'-biphenyl)-4,4'-diamine (TPD) and 4,4'-bis(N-(naphthyl)-N-phenylamino)biphenyl (α-NPD), oxazole, oxadiazole, triazole, imidazole, imidazolone, a stilbene derivative, a pyrazolone derivative, tetrahydroimidazole, a polyarylalkane, butadiene, 4,4',4''-tris(N-(3-methylphenyl)N-phenylamino)triphenylamine (m-MTDATA), a porphyrin compound such as porphin, copper tetraphenylporphin, phthalocyanine, copper phthalocyanine and titanium phthalocyanine oxide, a triazole derivative, an oxadiazole derivative, an imidazole derivative, a polyarylalkane derivative, a pyrazoline derivative, a pyrazolone derivative, a phenylenediamine derivative, an anilamine derivative, an amino-substituted chalcone derivative, an oxazole derivative, a styrylanthracene derivative, a fluorenone derivative, a hydrazone derivative, and a silazane derivative. As for the polymer material, a polymer such as phenylenevinylene, fluorene, carbazole, indole, pyrene, pyrrole, picolin, thiophene, acetylene and diacetylene, or a derivative thereof may be used.

A compound having a sufficient hole transporting property may be used even if it is not an electron-donating compound. Specifically, for example, the following compounds of JP-A-2008-72090 are preferably used. Incidentally, in the following, Ea indicates the electron affinity of the material, and Ip indicates the ionization potential of the material. "EB" of EB-1, EB-2 and the like is the abbreviation of "electron blocking"

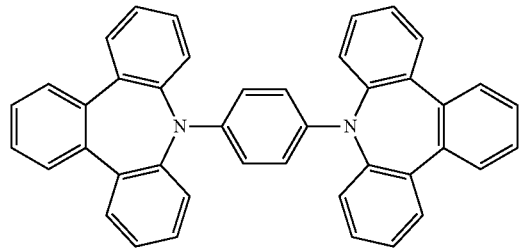

EB-1 : Ea = 1.9, Ip = 4.9

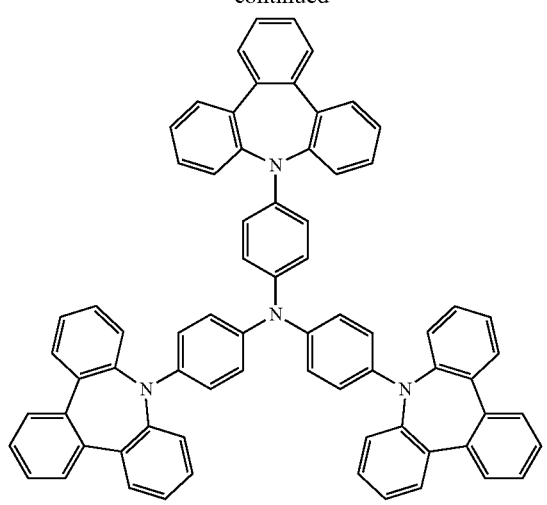

EB-2 : Ea = 1.7, Ip = 4.7

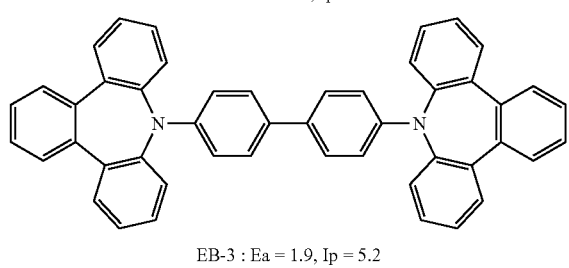

EB-3 : Ea = 1.9, Ip = 5.2

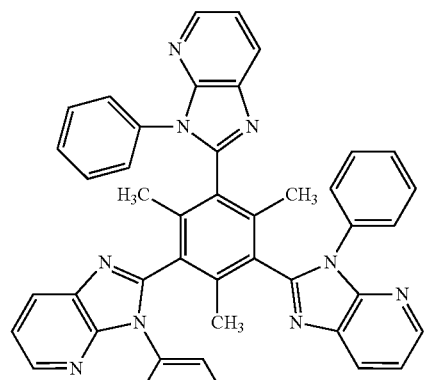

EB-4 : Ea = 2.1, Ip = 5.4

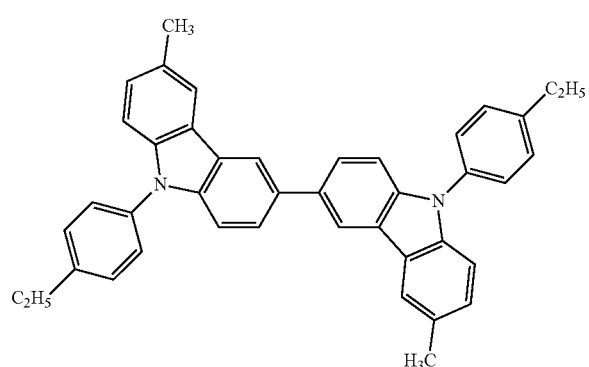

EB-5 : Ea = 2.1, Ip = 5.8

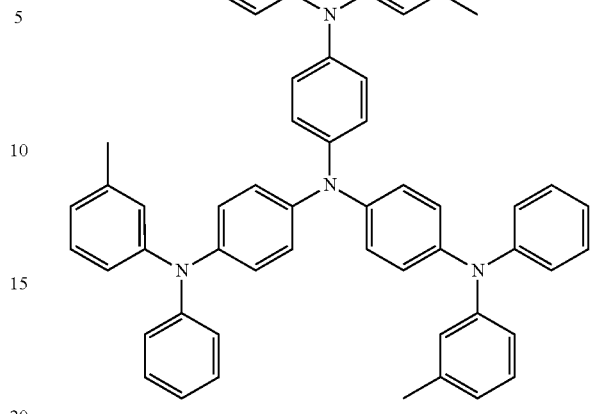

m-MTDATA : Ea = 1.9, Ip = 5.1

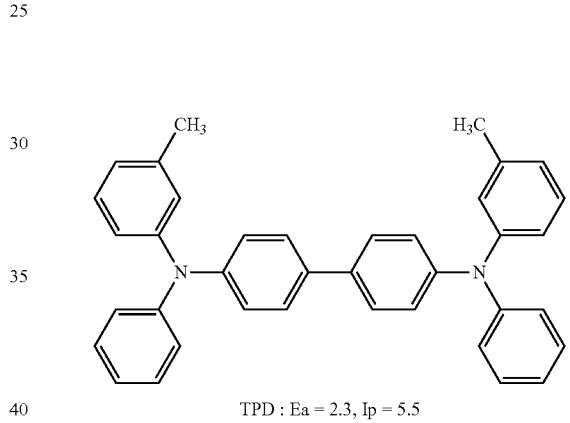

TPD : Ea = 2.3, Ip = 5.5

(Hole Blocking Layer)

The charge blocking layer may be a hole blocking layer.

For the hole-blocking layer, an electron-accepting organic material can be used. Examples of the electron-accepting material which can be used include an oxadiazole derivative such as 1,3-bis(4-tert-butylphenyl-1,3,4-oxadiazolyl)phenylene (OXD-7); an anthraquinodimethane derivative; a diphenylquinone derivative; bathocuproine, bathophenanthroline and their derivatives; a triazole compound; a tris(8-hydroxyquinolinato)aluminum complex; a bis(4-methyl-8-quinolinato)aluminum complex; a distyrylarylene derivative; and a silole compound. Also, a material having sufficient electron transporting property may be used even if it is not an electron-accepting organic material. A porphyrin-based compound, a styryl-based compound such as DCM (4-dicyanomethylene-2-methyl-6-(4-(dimethylaminostyryl))-4H pyran), and a 4H pyran-based compound can be used.

Specifically, for example, the following compounds described in JP-A-2008-72090 and an inorganic oxide such as $CeO_2$, $Ta_2O_5$, $SiO$, $TiO_2$, $GaO$, $TiO$, $WO_3$, $In_2O_3$, $GeO_2$, $Ga_2O_3$, $ZnO$, $CaO$ and $MoO_3$ are preferably used. "HB" of HB-1, HB-2 and the like is the abbreviation of "hole blocking".

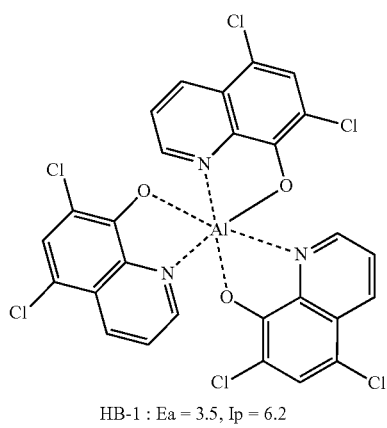

HB-1 : Ea = 3.5, Ip = 6.2

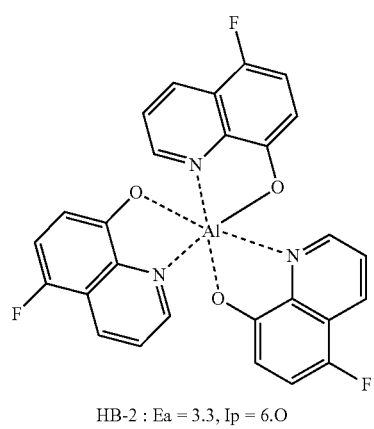

HB-2 : Ea = 3.3, Ip = 6.0

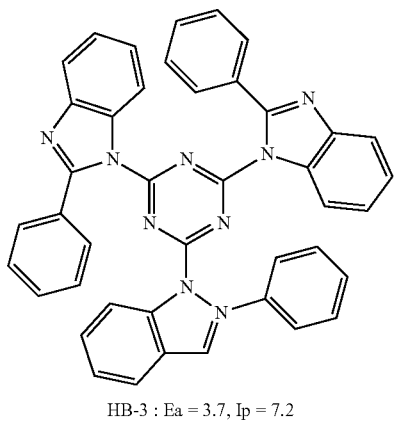

HB-3 : Ea = 3.7, Ip = 7.2

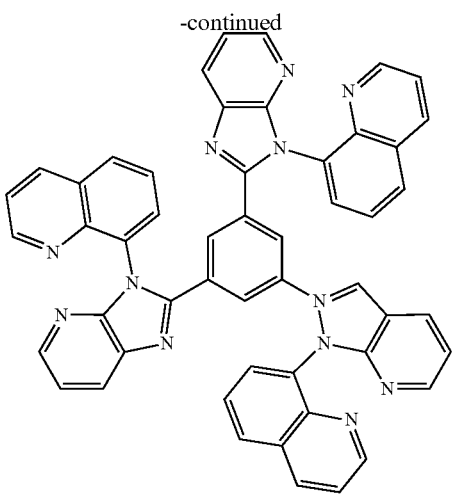

HB-4 : Ea = 3.6, Ip = 7.6

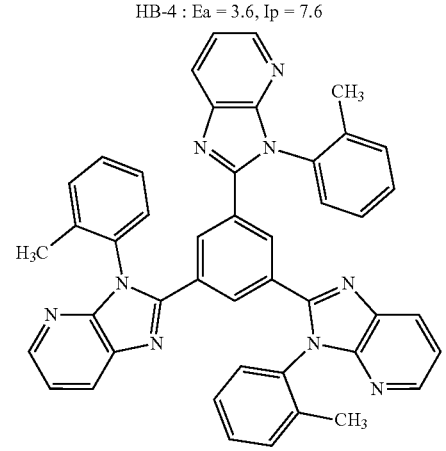

HB-5 : Ea = 3.6, Ip = 7.6

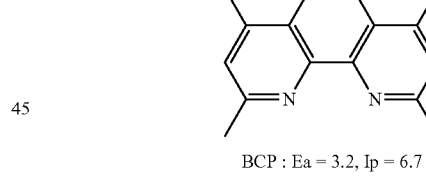

BCP : Ea = 3.2, Ip = 6.7

The photoelectric conversion devices of FIGS. 1(*a*), (*b*) and (*c*) can be produced using the above-described various materials, and a photoelectric conversion device capable of performing photoelectric conversion with high efficiency from the initial stage of operation can be fabricated. Particularly, by mixing a fullerene polymer to the bulk-heterostructure of the organic photoelectric conversion layer 12 in addition to an organic photoelectric conversion dye and a fullerene (or a fullerene derivative), a high photoelectric conversion efficiency can be obtained.

Figure 2:
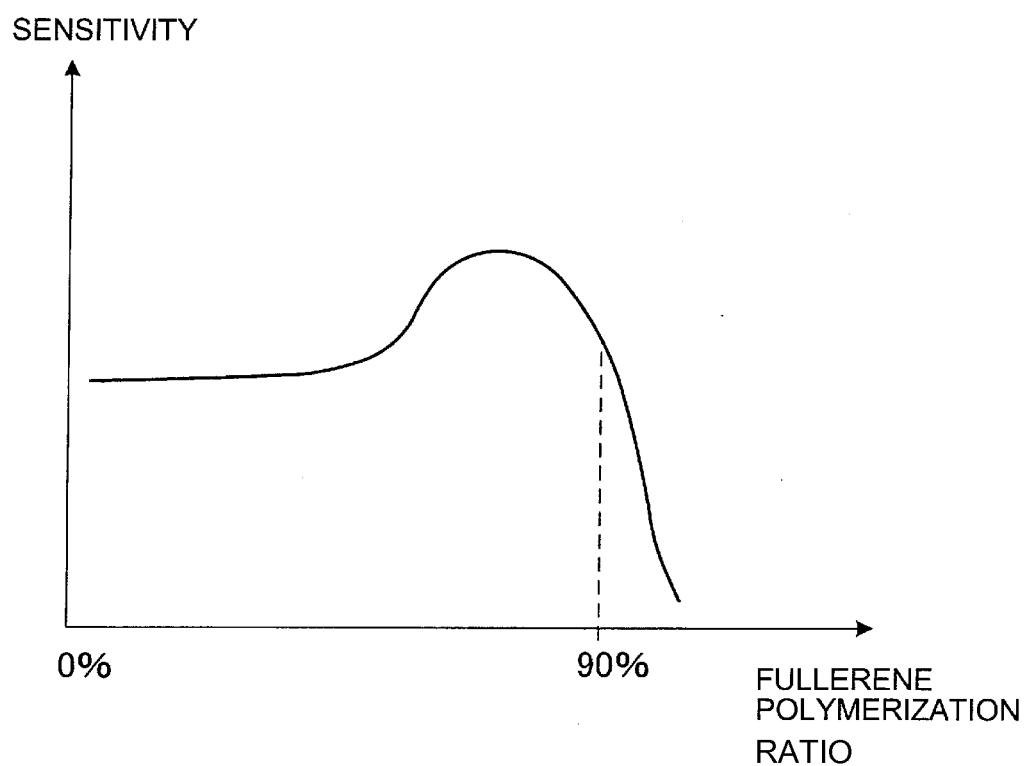
FIG. 2 is a graph qualitatively showing the relationship between the fullerene polymerization ratio and the sensitivity.

FIG. 2 is a graph showing the relationship between the sensitivity and the fullerene polymerization ratio of the organic photoelectric conversion layer 12. Even when the photoelectric conversion layer is produced by co-depositing an organic photoelectric conversion dye and a fullerene (or a fullerene derivative) and photoelectric conversion is performed using the photoelectric conversion layer in which a fullerene polymer is not present yet, a high photoelectric conversion efficiency cannot be obtained at first, but as the light irradiation goes on, fullerene polymerization proceeds in the organic photoelectric conversion layer 12. when the fullerene polymerization ratio in the organic photoelectric conversion layer 12 becomes high, the sensitivity (photoelectric conversion efficiency) is increased.

Although the sensitivity increases when a high fullerene polymerization ratio is achieved in the organic photoelectric conversion layer 12, how high polymerization ratio allows the sensitivity to start rising varies depending on the material of the organic photoelectric conversion dye, the material of fullerene (or fullerene derivative) used, and the ratio between the organic photoelectric conversion dye and the fullerene (or fullerene derivative) when performing co-deposition.

Accordingly, at what percentage of the fullerene polymerization ratio the increase of sensitivity starts cannot be indiscriminately indicated, but in terms of qualitative characteristics, the characteristics shown in FIG. 2 are given. Regardless of the material or ratio used, by setting the fullerene polymerization ratio in the organic photoelectric conversion layer to at least 10% or more, preferably 20% or more, at the delivery of the photoelectric conversion device as a product, a high photoelectric conversion efficiency can be obtained from the initial stage of operation.

In FIG. 2, the sensitivity extremely decreases when the fullerene polymerization ratio becomes excessively high (for example, 90% or more), but this excessive rise can be inhibited when a quencher (for example, oxygen) capable of depriving the fullerene in a state of emitting fluorescence, that is, the fullerene in an excited state, of the excitation energy is incorporated into the organic photoelectric conversion layer 12.

The photoelectric conversion devices can be roughly classified into a photocell and a photosensor, the photoelectric conversion devices shown in FIGS. 1(*b*) and (*c*) are suitable for a photosensor. The photosensor may be a sensor using a photoelectric conversion device alone or may be in the form of a line sensor where photoelectric conversion devices are linearly arranged, or a two-dimensional sensor where photoelectric conversion devices are arranged on a plane surface.

In the line sensor, the optical image information is converted into electrical signals by using an optical system and a driving unit as in a scanner and the like, and in the two-dimensional sensor, the optical image information is imaged on the sensor by an optical system and converted into electrical signals, thereby effecting the function as an imaging device.

The photocell (solar cell) is power-generating equipment and the efficiency of converting light energy into electrical energy is an important performance, but the dark current which is a current in the dark place does not become a problem in the light of function of the photocell. Also, unlike the imaging device, a color filter need not be provided and therefore, a heating step in the later stage is not required.

In the photosensor, the performance of converting the light-dark signals into electrical signals with high precision is important, and the efficiency of converging the light quantity into a current is also an important performance. Moreover, unlike the photocell, a signal that is output in the dark place works out to a noise deteriorating the image, and therefore, a low dark current is required. Furthermore, a durability against the later-stage production process of, for example, stacking a color filter is also important.

Figure 3:
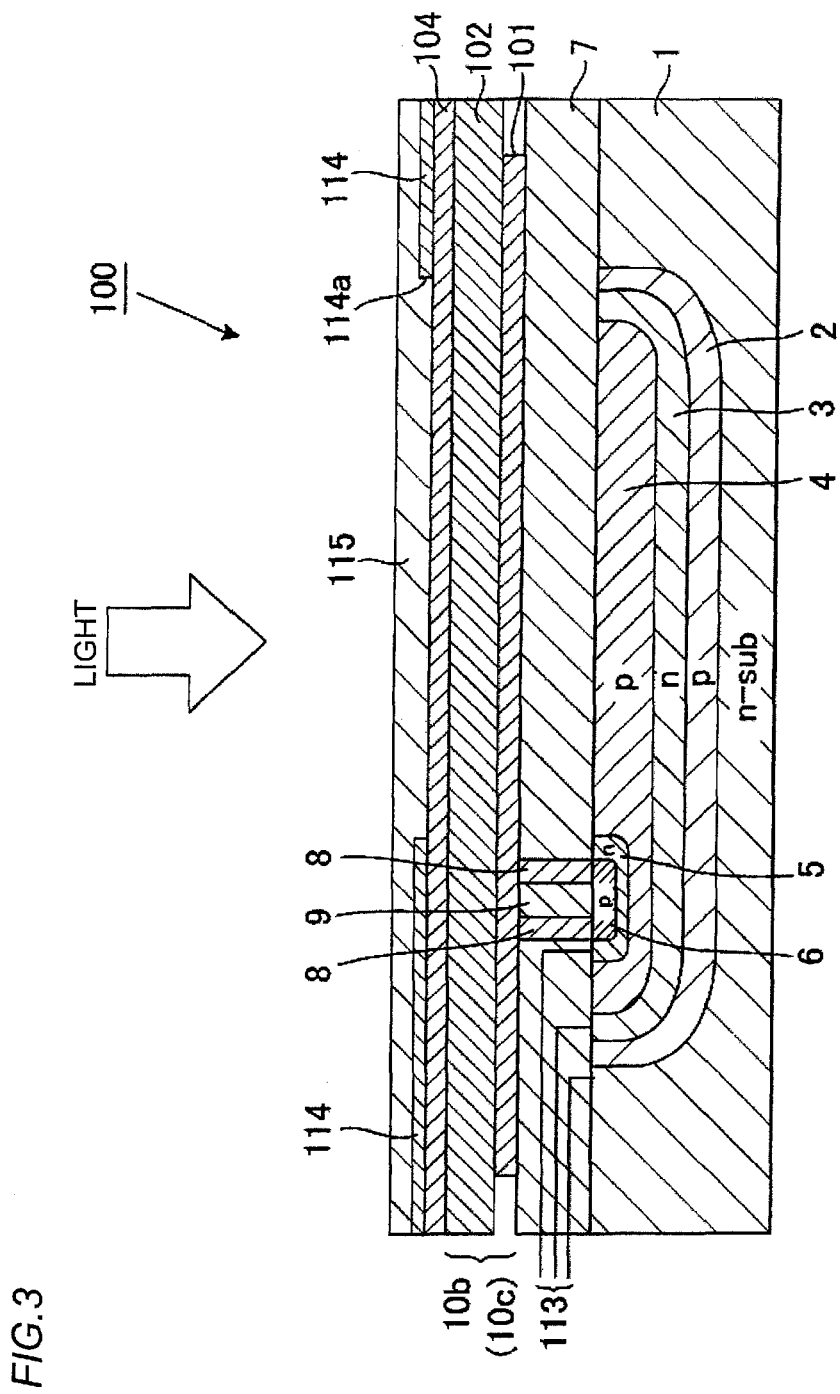
FIG. 3 is a schematic cross-sectional view showing the imaging device according to a fourth exemplary embodiment of the present invention.

FIG. 3 is a schematic cross-sectional view of one pixel portion of the imaging device according to a fourth embodiment of the present invention using the photoelectric conversion device described in FIGS. 1B and 1C. Here, as for the "one pixel", a pixel capable of obtaining RGB three color signals is used as a unit. Incidentally, in the configuration examples described below, the members and the like having the same configuration or action as the members and the like described in FIGS. 1A to 1C are indicated by the same or like symbols or numerical references in the figure, and their descriptions are simplified or omitted.

The imaging device indicates a device of converting optical information of an image into electrical signals, in which a plurality of photoelectric conversion devices are arranged in the same plane on a matrix, wherein light signals can be converted into electrical signals in each photoelectric conversion device (pixel) and the electrical signals can be sequentially output to the outside of the imaging device from each pixel. Therefore, the imaging device includes one photoelectric conversion device and one or more transistors per one pixel.

In the imaging device 100 shown in FIG. 3, a large number of pixels each constituting one pixel are disposed in an array manner on the same plane, and one-pixel data of the image data can be produced by the signals obtained from the one pixel.

The imaging device 100 comprises an n-type silicon substrate 1 and a transparent insulting film 7 formed on the n-type silicon substrate 1, and the photoelectric conversion device 10*b* or 10*c* described in FIG. 1B or FIG. 1C is formed on the insulting film 7. In the photoelectric conversion device shown in FIG. 3, the numerical references are a lower electrode 101, a photoelectric conversion layer 102 and an upper electrode 104, and in FIG. 3, an electron blocking layer and a hole blocking layer are not shown and omitted.

On the photoelectric conversion device 10*b* (or 10*c*), a light-shielding film 114 having provided therein an opening 114*a* is formed, and on the upper electrode 104 in the opening 114*a* as well as on the light-shielding film 114, a transparent insulating film 115 is formed.

Right below the opening 114*a* in the surface part of the n-type silicon substrate 1, a p-type impurity region (hereinafter simply referred to as "p-region") 4, an n-type impurity region (hereinafter simply referred to as "n-region") 3, and a p-region 2 are sequentially formed in order of increasing the depth. In the p-region 4, a high-concentration p-region 6 is formed in the surface part of the portion light-shielded by the light-shielding film 114, and the periphery of the p-region 6 is surrounded by an n-region 5.

The depth of the pn junction plane between the p-region 4 and the n-region 3 from the surface of the n-type silicon substrate 1 is set to a depth at which blue light is absorbed (about 0.2 μm). Therefore, the p-region 4 and the n-region 3 form a photodiode (B photodiode) of absorbing blue light and accordingly accumulating electric charges.

The depth of the pn junction plane between the p-region 2 and the n-type silicon substrate 1 from the surface of the n-type silicon substrate 1 is set to a depth at which red light is absorbed (about 2 μm). Therefore, the p-region 2 and the n-type silicon substrate 1 form a photodiode (R photodiode) of absorbing red light and accordingly accumulating electric charges.

The p-region 6 is electrically connected to the lower electrode 101 via a connection part 9 formed in the opening bored through the insulating film 7. A hole trapped by the lower electrode 101 recombines with an electron in the p-region 6 and therefore, the number of electrons accumulated in the p-region 6 on resetting decreases according to the number of holes trapped. The outer circumferential surface of the connection part 9 is covered with an insulating film 8, and the connection part 9 is electrically insulated by the insulating film 8 from portions other than the lower electrode 101 and the p-region 6.

The electrons accumulated in the p-region 2 are converted into signals according to the electric charge amount by an MOS circuit (not shown) including a p-channel MOS transistor formed inside the n-type silicon substrate 1, the electrons accumulated in the p-region 4 are converted into signals according to the electric charge amount by an MOS circuit (not shown) including a p-channel MOS transistor formed inside the n-region 3, the electrons accumulated in the p-region 6 are converted into signals according to the electric charge amount by an MOS circuit (not shown) including a p-channel MOS transistor formed inside the n-region 5, and these signals are output to the outside of the imaging device 100.

Each MOS circuit is connected to a signal readout pad (not shown) by wiring 113. Incidentally, when an extractor electrode is provided in the p-region 2 and p-region 4 and a predetermined reset potential is applied, each of the regions 2 and 4 is depleted and the capacitance of each pn junction part becomes an infinitely small value, whereby the capacitance produced in the junction plane can be made extremely small.

Thanks to such a configuration, G (green) light can be photoelectrically converted by the photoelectric conversion layer 102, and B (blue) light and R (red) light can be photoelectrically converted by the B photodiode and the R photodiode, respectively, in the n-type silicon substrate 1. Also, G light is first absorbed above the semiconductor substrate and therefore, excellent color separation between B-G and between G-R is achieved by the B photodiode and the R photodiode formed in the semiconductor substrate.

This color separation performance is a greatly excellent point of the imaging device in the embodiment of FIG. 3, compared with an imaging device of the type where three photodiodes of B photodiode, R photodiode and additionally G photodiode are provided inside a semiconductor substrate and all of B light, G light and R light are separated in the semiconductor substrate.

Figure 4:
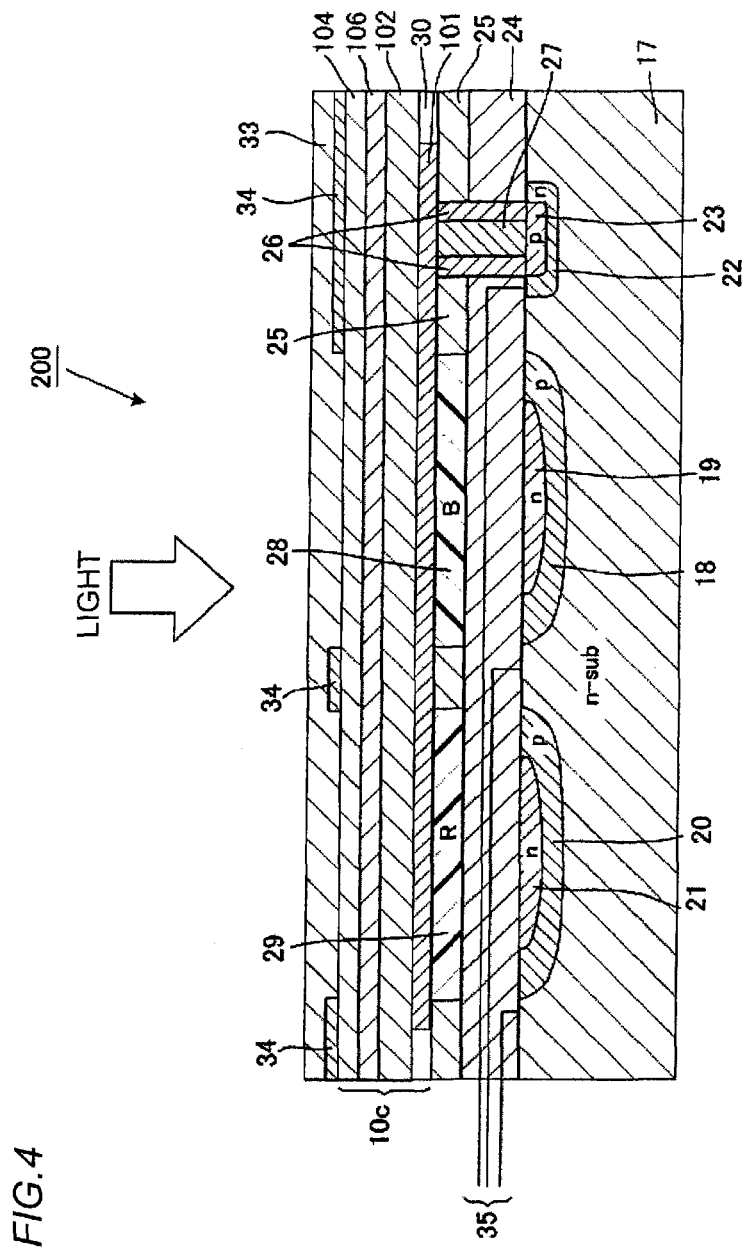
FIG. 4 is a schematic cross-sectional view showing the imaging device according to a fifth exemplary embodiment of the present invention.

FIG. 4 is a schematic cross-sectional view of one pixel portion of the imaging device according to a fifth embodiment of the present invention. In the imaging device 200 of this embodiment, instead of a configuration where two photodiodes are stacked inside a semiconductor substrate 1 as in the imaging device 100 of FIG. 3, two photodiodes are arrayed in the direction perpendicular to the incident direction of incident light (that is, the direction along the surface of the semiconductor substrate) so that lights of two colors can be detected inside the n-type silicon substrate.

In FIG. 4, the imaging device 200 of this embodiment comprises an n-type silicon substrate 17, a transparent insulating film 24 formed on the surface of the n-type silicon substrate 17, and the photoelectric conversion device 10c described in FIG. 1C stacked thereon. The same numerical references as in FIG. 3 of lower electrode 101, photoelectric conversion layer 102 and upper electrode 104 are used for the members constituting the photoelectric conversion device 10c shown in FIG. 4, and an electron blocking layer is not shown and omitted, but a hole blocking layer 106 is shown. Incidentally, the photoelectric conversion device may be the photoelectric conversion device 10b of FIG. 1B. A light-shielding film 34 is formed on the photoelectric conversion device 10c, and a transparent insulating film 33 is formed on the light-shielding film 34 of the upper electrode 104.

In the n-type silicon substrate 17 surface part below the light-shielding film 34, a photodiode consisting of an n-region 19 and a p-region 18 and a photodiode consisting of an n-region 21 and a p-region 20 are formed in juxtaposition on the surface of the n-type silicon substrate 17. An arbitrary plane direction on the n-type silicon substrate 17 surface becomes the direction perpendicular to the incident direction of incident light.

Above the photodiode consisting of an n-region 19 and a p-region 18, a color filter 28 capable of transmitting B light is formed via a transparent insulating film 24, and the lower electrode 101 is formed thereon. Above the photodiode consisting of an n-region 21 and a p-region 20, a color filter 29 capable of transmitting R light is formed via the transparent insulating film 24, and the lower electrode 101 is formed thereon. The peripheries of the color filters 28 and 29 are covered with a transparent insulating film 25. Incidentally, the numeral 30 between the lower electrodes (pixel electrodes) 101 is an insulating layer for separating the pixel electrodes.

The photodiode consisting of an n-region 19 and a p-region 18 functions as an in-substrate photoelectric conversion part that absorbs B light transmitted through the color filter 28, accordingly generates electrons and accumulates the generated electrons in the p-region 18. The photodiode consisting of an n-region 21 and a p-region 20 functions as an in-substrate photoelectric conversion part that absorbs R light transmitted through the color filter 29, accordingly generates electrons and accumulates the generated electrons in the p-region 20.

In the portion light-shielded by the light-shielding film 34 on the n-type silicon substrate 17 surface, a p-region 23 is formed, and the periphery of the p-region 23 is surrounded by an n-region 22.

The p-region 23 is electrically connected to the lower electrode 101 via a connection part 27 formed in the opening bored through the insulating films 24 and 25. A hole generated in the photoelectric conversion layer 102 and trapped by the lower electrode 101 passes through the connection part 27 and recombines with an electron in the p-region 23 and therefore, the number of electrons accumulated in the p-region 23 on resetting decreases according to the number of holes trapped. The periphery of the connection part 27 is surrounded by an insulating film 26, and this part is electrically insulated from portions other than the lower electrode 101 and the p-region 23.

The electrons accumulated in the p-region 18 are converted into signals according to the electric charge amount by an MOS circuit (not shown) including a p-channel MOS transistor formed inside the n-type silicon substrate 17, the electrons accumulated in the p-region 20 are converted into signals according to the electric charge amount by an MOS circuit (not shown) including a p-channel MOS transistor formed inside the n-type silicon substrate 17, the electrons accumulated in the p-region 23 are converted into signals according to the electric charge amount by an MOS circuit (not shown) including an n-channel MOS transistor formed inside the n-region 22, and these converted signals are output to the outside of the imaging device 200. Each MOS circuit is connected to a signal readout pad (not shown) by wiring 35.

In this connection, instead of those MOS circuits, the signal readout circuit including an MOS transistor may include CCD and an amplifier, that is, may have a configuration where electrons accumulated in each of the p-region 18, the p-region 20 and the p-region 23 are read out into CCD (charge transfer path) formed inside the n-type silicon substrate 17 and then transferred to an amplifier and voltage signals according to the electrons transferred are output as taken-in image signals by the amplifier.

In this way, the signal readout part includes a CCD structure and a CMOS structure, but CMOS is preferred in view of power consumption, high-speed readout, easiness of pixel addition, easiness of partial readout, and the like. Incidentally, in the imaging device 200 of FIG. 4, color separation of R light and B light is performed by the color filters 28 and 29, but instead of providing the color filters 28 and 29, the depth of the pn junction plane between the p-region 20 and the n-region 21 and the depth of the pn junction plane between the p-region 18 and the n-region 19 may be adjusted to absorb R light and B light by respective photodiodes.

Also, an inorganic photoelectric conversion part including an inorganic material that absorbs light transmitted through the photoelectric conversion layer 102, accordingly generates electric charges and accumulates the electric charges, may be formed between the n-type silicon substrate 17 and the lower electrode 101 (for example, between the insulating film 24 and the n-type silicon substrate 17). In this case, an MOS circuit for reading out signals according to electric charges accumulated in a charge accumulation region of the inorganic photoelectric conversion part may be provided inside the n-type silicon substrate 17, and wiring 35 may be connected also to this MOS circuit.

Also, there may employ a configuration where one photodiode per one pixel is provided inside the n-type silicone substrate 17 and a plurality of photoelectric conversion layers are stacked above the n-type silicon substrate 17. For example, G signals are detected by a photodiode, and a first photoelectric conversion layer for detecting R signals and a second photoelectric conversion layer for detecting B signals are stacked.

Furthermore, there may be employed a configuration where a plurality of photodiodes per one pixel are provided inside the n-type silicon substrate 17 and a plurality of photoelectric conversion layers are stacked above the n-type silicon substrate 17. For example, an imaging device of detecting four colors of R, G, B and emerald color by one pixel may be fabricated, where two colors are detected by two photodiodes and the remaining two colors are detected by two photoelectric conversion layers.

In the case where a color image need not be formed, there may be employed such a configuration that one photodiode per one pixel is provided inside the n-type silicon substrate 17 and only one photoelectric conversion layer is stacked.

Figure 5:
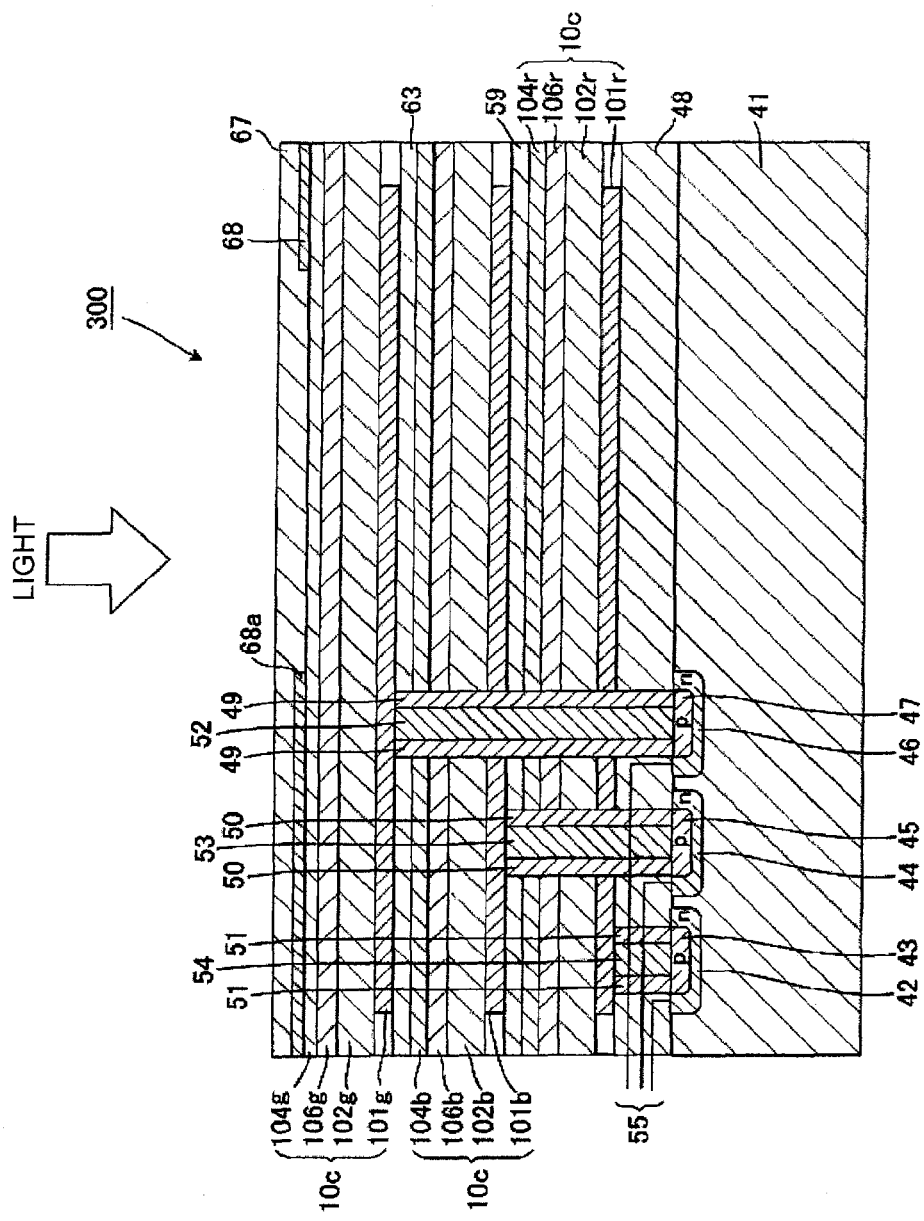
FIG. 5 is a schematic cross-sectional view showing the imaging device according to a sixth exemplary embodiment of the present invention.

FIG. 5 is a schematic cross-sectional view of one pixel portion of the imaging device according to a sixth embodiment of the present invention. The imaging device 300 of this embodiment is fabricated to have such a configuration that three color signals of R, G and B are detected by three photoelectric conversion layers provided above a silicon substrate without providing a photodiode inside the silicon substrate.

The imaging device 300 of this embodiment has a configuration where three photoelectric conversion devices, that is, an R photoelectric conversion device for detecting R light, a B photoelectric conversion device for detecting B light and a G photoelectric conversion device for detecting G light, are stacked in this order above the silicon substrate 41. Each photoelectric conversion device is based on the configuration of FIG. 1C, but the organic photoelectric conversion dye used for the photoelectric conversion layer is a material capable of efficiently detecting the wavelength of light to be detected.

The R photoelectric conversion device consists of a lower electrode 101r stacked above the silicon substrate 41 via an insulating layer 48, a photoelectric conversion layer 102r formed on the lower electrode 101r, a hole blocking layer 106r formed on the photoelectric conversion layer 102r, and an upper electrode 104r formed on the hole blocking layer 106r. Incidentally, the electron blocking layer shown in FIG. 1C is omitted and not shown in FIG. 5 (the same applies to the following photoelectric conversion devices).

The B photoelectric conversion device consists of a lower electrode 101b stacked on the upper electrode 104r of the R photoelectric conversion device through a transparent insulating layer 59, a photoelectric conversion layer 102b formed on the lower electrode 101b, a hole blocking layer 106b formed on the photoelectric conversion layer 102b, and an upper electrode 104b formed on the hole blocking layer 106b.

The G photoelectric conversion device consists of a lower electrode 101g stacked on the upper electrode 104b of the B photoelectric conversion device through a transparent insulating layer 63, a photoelectric conversion layer 102g formed on the lower electrode 101g, a hole blocking layer 106g formed on the photoelectric conversion layer 102g, and an upper electrode 104g formed on the hole blocking layer 106g.

In this way, the imaging device 300 of this embodiment has a configuration where an R photoelectric conversion device, a B photoelectric conversion device and a G photoelectric conversion device are stacked in this order on a silicon substrate 41.

A light-shielding film 68 having produced therein an opening 68a is formed on the upper electrode 104g of the G photoelectric conversion device stacked as the uppermost layer, and a transparent insulating film 67 is formed to cover the upper electrode 104g exposed in the opening 68a and the light-shielding film 68.

The lower electrode, photoelectric conversion layer and upper electrode contained in each of the photoelectric conversion devices of R, G and B include the same materials as those in the embodiments above. However, as described above, the photoelectric conversion layer 102g contains an organic material capable of absorbing green light and accordingly generating electrons and holes, the photoelectric conversion layer 102b contains an organic material capable of absorbing blue light and accordingly generating electrons and holes, and the photoelectric conversion layer 102r contains an organic material capable of absorbing red light and accordingly generating electrons and holes.

In the portion light-shielded by the light-shielding film 68 on the silicon substrate 41 surface, p-regions 43, 45 and 47 are formed, and the peripheries of these regions are surrounded by n-regions 42, 44 and 46, respectively.

The p-region 43 is electrically connected to the lower electrode 101r via a connection part 54 formed in an opening bored through an insulating film 48. A hole trapped by the lower electrode 101r recombines with an electron in the p-region 43 and therefore, the number of electrons accumulated in the p-region 43 on resetting decreases according to the number of holes trapped. An insulating film 51 is formed in the outer circumference of the connection part 54, and the connection part 54 is electrically insulated from portions other than the lower electrode 101r and the p-region 43.

The p-region 45 is electrically connected to the lower electrode 101b via a connection part 53 formed in an opening bored through the insulating film 48, the R photoelectric conversion device and an insulating film 59. A hole trapped by the lower electrode 101b recombines with an electron in the p-region 45 and therefore, the number of electrons accumulated in the p-region 45 on resetting decreases according to the number of holes trapped. An insulating film 50 is formed in the outer circumference of the connection part 53, and the connection part 53 is electrically insulated from portions other than the lower electrode 101b and the p-region 45.

The p-region 47 is electrically connected to the lower electrode 101g via a connection part 52 formed in an opening bored through the insulating film 48, the R photoelectric conversion device, the insulating film 59, the B photoelectric conversion device and an insulating film 63. A hole trapped by the lower electrode 101g recombines with an electron in the p-region 47 and therefore, the number of electrons accumulated in the p-region 47 on resetting decreases according to the number of holes trapped. An insulating film 49 is formed in the outer circumference of the connection part 52, and the connection part 52 is electrically insulated from portions other than the lower electrode 101g and the p-region 47.

The electrons accumulated in the p-region 43 are converted into signals according to the electric charge amount by an MOS circuit (not shown) including a p-channel MOS transistor formed inside the n-region 42, the electrons accumulated in the p-region 45 are converted into signals according to the electric charge amount by an MOS circuit (not shown) including a p-channel MOS transistor formed inside the n-region 44, the electrons accumulated in the p-region 47 are converted into signals according to the electric charge amount by an MOS circuit (not shown) including a p-channel MOS transistor formed inside the n-region 46, and these signals are output to the outside of the imaging device 300. Each MOS circuit is connected to a signal readout pad (not shown) by wiring 55.

Incidentally, instead of those MOS circuits, the signal readout part may include CCD and an amplifier, similarly to the fifth embodiment.

For the photoelectric conversion layer 102b that absorbs B light, for example, a material capable of absorbing at least light at a wavelength of 400 to 500 nm is used, and it is more preferred to use a material having an absorption factor of 50% or more at the peak wavelength in the wavelength region above.

For the photoelectric conversion layer 102g that absorbs G light, for example, a material capable of absorbing at least light at a wavelength of 500 to 600 nm is used, and it is more preferred to use a material having an absorption factor of 50% or more at the peak wavelength in the wavelength region above.

For the photoelectric conversion layer 102r that absorbs R light, for example, a material capable of absorbing at least light at a wavelength of 600 to 700 nm is used, and it is more preferred to use a material having an absorption factor of 50% or more at the peak wavelength in the wavelength region above.

Figure 6:
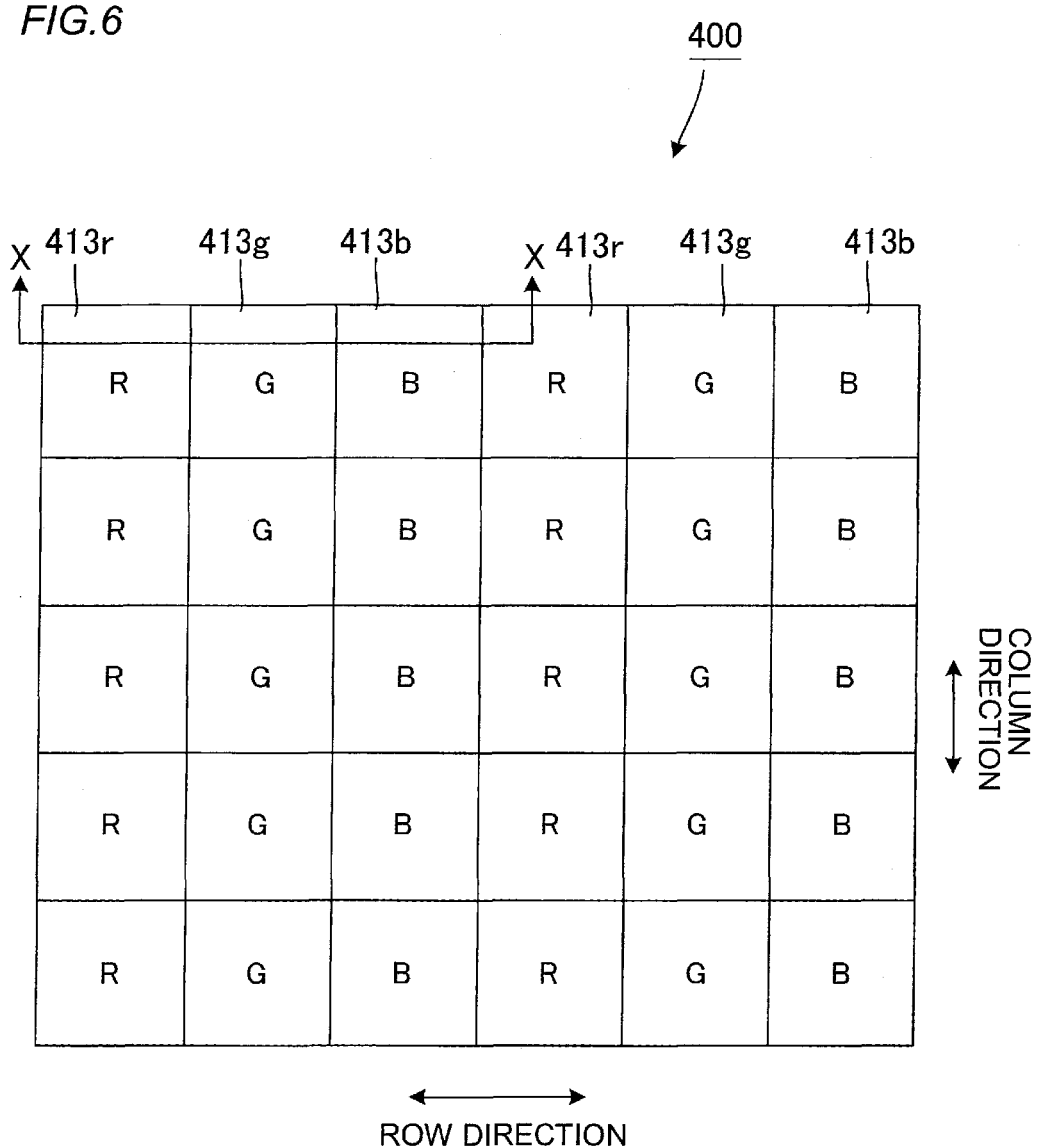
FIG. 6 is a schematic partial surface view showing the imaging device according to a seventh exemplary embodiment of the present invention.

FIG. 6 is a schematic partial surface view of the imaging device 400 according to a seventh embodiment of the present invention, and FIG. 7 is a schematic cross-sectional view at the line X-X of FIG. 6.

A p-well layer 402 is formed on an n-type silicon substrate 401. In the following, the n-type silicon substrate 401 and the p-well layer 402 are collectively referred to as a semiconductor substrate. In the row direction (see, FIG. 7) and the column direction crossing with the row direction at right angles (see, FIG. 7) in the same plane above the semiconductor substrate, three kinds of color filters, that is, a color filter 413r mainly transmitting R light, a color filter 413g mainly transmitting G light, and a color filter 413b mainly transmitting B light, each is numerously arrayed. Each of the color filters 413r, 413g and 413b can be produced using a known material.

As for the array of color filters 413r, 413g and 413b, a color filter array used in known single-plate solid-state imaging devices (e.g., Bayer array, longitudinal stripe, lateral stripe) may be employed.

Inside the p-well layer 402 in the lower part of the color filters 413r, 413g and 413b, high-concentration n+ regions 404r, 404g and 404b are formed and signal readout parts 405r, 405g and 405b are formed adjacent to respective regions. Electric charges generated in the later-described photoelectric conversion film 412 according to the incident light quantity are accumulated in the n+ regions 404r, 404g and 404b.

An insulating layer 403 is stacked on the surface of the p-well layer 402, and pixel electrode (lower electrode) films 411r, 411g and 411b corresponding to the n+ regions 404r, 404g and 404b, respectively, are formed on the insulating layer 403. An insulating layer 408 is provided among the pixel electrodes 411r, 411g and 411b, and the pixel electrodes 411r, 411g and 411b are thereby separated from each other to correspond to the color filters 413r, 413g and 413b, respectively.

A photoelectric conversion film 412 in a monolithic configuration shared in common among the color filters 413r, 413g and 413b is formed on the lower electrodes 411r, 411g and 411b.

An upper electrode 413 in a monolithic configuration shared in common among the color filters 413r, 413g and 413b is formed on the photoelectric conversion film 412, a transparent insulating layer 415 and a transparent flat layer 416 are stacked on the upper electrode 413, and the color filters 413r, 413g and 413b are stacked thereon.

A photoelectric conversion device corresponding to the color filter 413r is formed by the lower electrode 411r, the upper electrode 413 opposing it, and a part of the photoelectric conversion film 412 sandwiched therebetween. This photoelectric conversion device works as an R photoelectric conversion device.

A photoelectric conversion device corresponding to the color filter 413g is formed by the lower electrode 411g, the upper electrode 413 opposing it, and a part of the photoelectric conversion film 412 sandwiched therebetween. This photoelectric conversion device works as a G photoelectric conversion device.

A photoelectric conversion device corresponding to the color filter 413b is formed by the lower electrode 411b, the upper electrode 413 opposing it, and a part of the photoelectric conversion film 412 sandwiched therebetween. This photoelectric conversion device works as a B photoelectric conversion device.

The lower electrodes 411r, 411g and 411b are electrically connected to the corresponding n+ regions 404r, 404g and 404b in the contact parts 406r, 406g and 406b, respectively, formed in the opening bored through the insulating layer 403. The contact parts 406r, 406g and 406b are formed of a metal such as aluminum.

Incidentally, for preventing light transmitted through the photoelectric conversion film 412 from entering the n+ regions 404r, 404g and 404b, a light-shielding film is preferably provided above each. It is also possible that the lower electrodes 411r, 411g and 411b are formed as an opaque electrode film or a high-reflectance electrode film and serves also as a light-shielding film and the insulating layer 408 separating the lower electrodes from each other is formed of an opaque material or a reflective material.

In such a configuration, when light from a subject enters the imaging device 400 in the state of a bias voltage being applied between the pixel electrodes 411r, 411g and 411b and the opposite electrode (upper electrode) 413, light passed through the red filter 413r enters the photoelectric conversion film 412 on the pixel electrode 411r to generate an electric charge. This electric charge transfers to the corresponding n+ region 404r through the contact part 406r, and electric charges according to the quantity of incident red light are accumulated in the n+ region (charge accumulation region) 404r.

Similarly, light passed through the green filter 413g enters the photoelectric conversion film 412 on the pixel electrode 411g to generate an electric charge. This electric charge transfers to the corresponding n+ region 404g through the contact part 406g, and electric charges according to the quantity of incident green light are accumulated in the n+ region (charge accumulation region) 404g.

Similarly, light passed through the blue filter 413b enters the photoelectric conversion film 412 on the pixel electrode 411b to generate an electric charge. This electric charge transfers to the corresponding n+ region 404b through the contact part 406b, and electric charges according to the quantity of incident blue light are accumulated in the n+ region (charge accumulation region) 404b.

Signals according to the accumulated electric chares of the charge accumulation regions 404r, 404g and 404b are read out to the outside of the imaging device 400 by the adjacent signal readout parts 405r, 405g and 405b. Similarly to the above-described embodiments, the signal readout parts 405r, 405g and 405b may be a CMOS circuit or a CCD circuit.

In this way, according to the imaging device 400 of this embodiment, a color image can be obtained and furthermore, the photoelectric conversion device is thin, so that the resolution of the taken-in image can be enhanced and the false color can be reduced. Also, independently of the signal readout circuit provided in the semiconductor substrate, the aperture ratio can be made large and therefore, the sensitivity can be increased. In addition, a microlens employed in conventional CCD-type or CMOS-type image sensors can be omitted, and this is effective in reducing the number of components and production steps.

The organic photoelectric conversion film 412 used in this embodiment needs to exhibit a maximum absorption wavelength in the green light region and have an absorption over the entire visible region, and this can be realized by selecting and using the materials described above.

EXAMPLES

The present invention is described in greater detail below by referring to Examples, but the present invention is not limited to these Examples.

Example 1

Synthesis of Compound 15

Compound 15 that is one of arylidene compounds was synthesized in accordance with a known method (U.S. Patent Application Publication No. 2005/0065351).

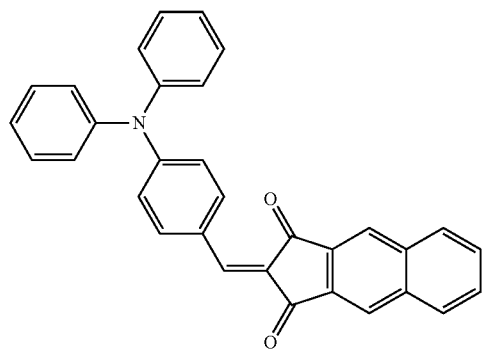

15

(Fabrication of Device)

On a semiconductor substrate having formed therein a CMOS circuit as a signal readout circuit, an amorphous ITO layer was deposited by sputtering to a thickness of 30 nm and patterned by photolithography to allow one pixel to exist for each photodiode (PD) on the semiconductor substrate, thereby forming pixel electrodes, and a layer of an electron blocking material (EB-3) was deposited thereon to a thickness of 100 nm by vacuum heating deposition. Subsequently, a layer of 400 nm in thickness obtained by co-depositing Compound 15 and fullerene ($C_{60}$) in a ratio of 200 nm and 200 nm in terms of a single layer was deposited thereon by vacuum heating deposition to form a photoelectric conversion layer. Furthermore, an amorphous ITO layer was deposited as the upper electrode by sputtering to a thickness of 5 nm to form a transparent electrode, whereby a solid-state imaging device was fabricated. On the upper electrode, an SiO film was formed as a protective layer by heating vapor deposition, and an $Al_2O_3$ layer was formed thereon by an ALCVD method. For all layers of the photoelectric conversion layer 12, the vacuum deposition was performed at a vacuum degree of $4\times10^{-4}$ Pa or less. The solid-state imaging device obtained by these operations was irradiated with white light of 1,000 lx (fluorescent lamp for color viewer (wavelength: from 400 to 700 nm), manufactured by Dai-Nippon Printing Co., Ltd.) for 168 hours to fabricate the solid-state imaging device of the present invention.

EB-3: Ea=1.9, Ip=5.2

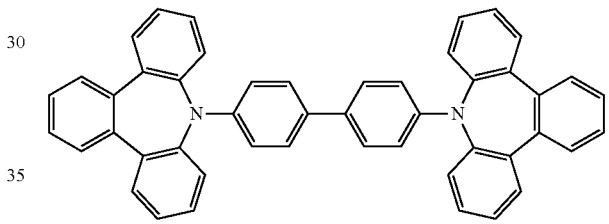

Example 2

Synthesis of Compound 16

Compound 16 that is one of arylidene compounds was synthesized in accordance with a known method (U.S. Patent Application Publication No. 2005/0065351).

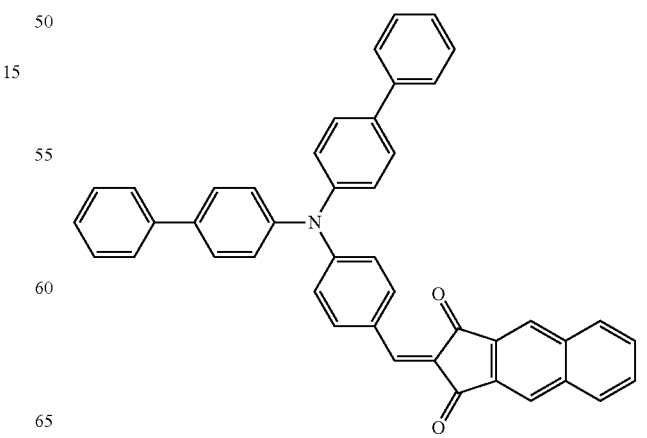

16

Identification of Compound 16

$^1$H NMR (CDCl$_3$) δ: 7.16 (2H, d), 7.30-7.40 (6H, m), 7.42-7.51 (4H, m), 7.60-7.70 (10H, m), 7.90 (1H, s), 8.09 (2H, m), 8.46 (2H, d), 8.55 (2H, d).

(Fabrication of Device)

A solid-state imaging device was fabricated in the same manner as in Example 1 except for changing Compound 15 in the organic photoelectric conversion layer 12 to Compound 16.

Example 3

Synthesis of Compound 17

Compound 17 was synthesized in accordance with a known method (U.S. Patent Application Publication No. 2005/0065351).

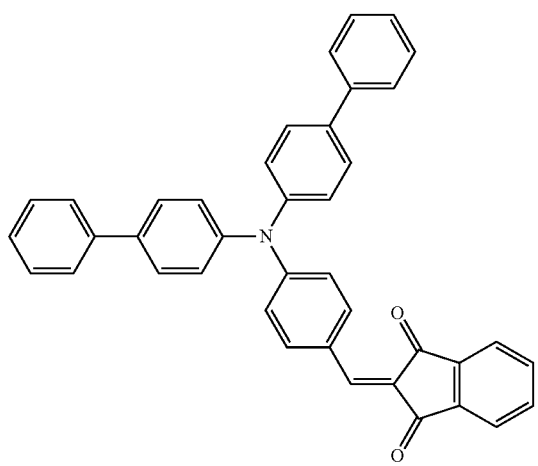

17

(Fabrication of Device)

A solid-state imaging device was fabricated in the same manner as in Example 1 except for changing Compound 15 in the organic photoelectric conversion layer 12 to Compound 17.

Example 4

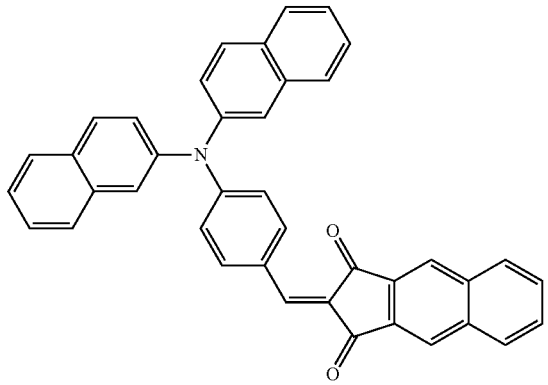

18

Synthesis of Compound 18

Compound 18 was synthesized in accordance with a known method (U.S. Patent Application Publication No. 2005/0065351).

(Fabrication of Device)

A solid-state imaging device was fabricated in the same manner as in Example 1 except for changing Compound 15 in the organic photoelectric conversion layer 12 to Compound 18.

Example 5

Synthesis of Compound 19

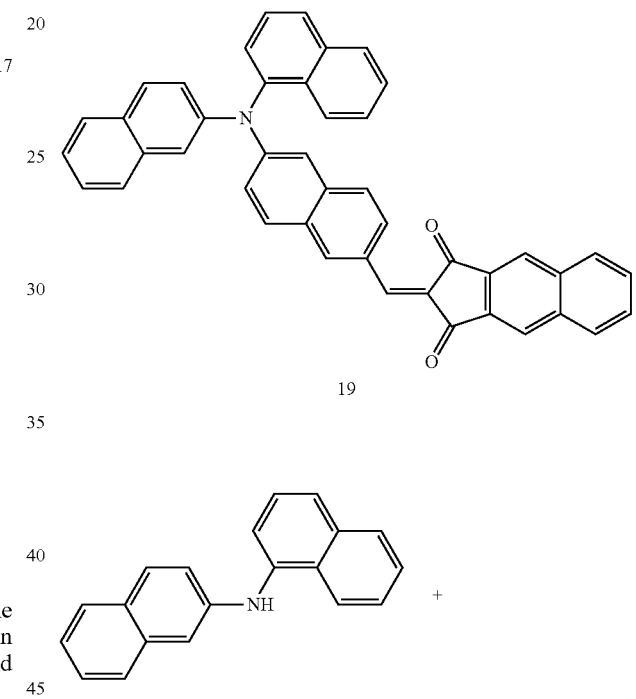

19

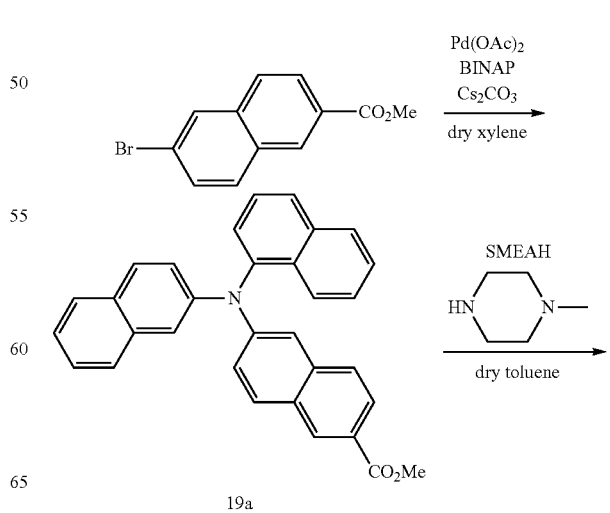

19a

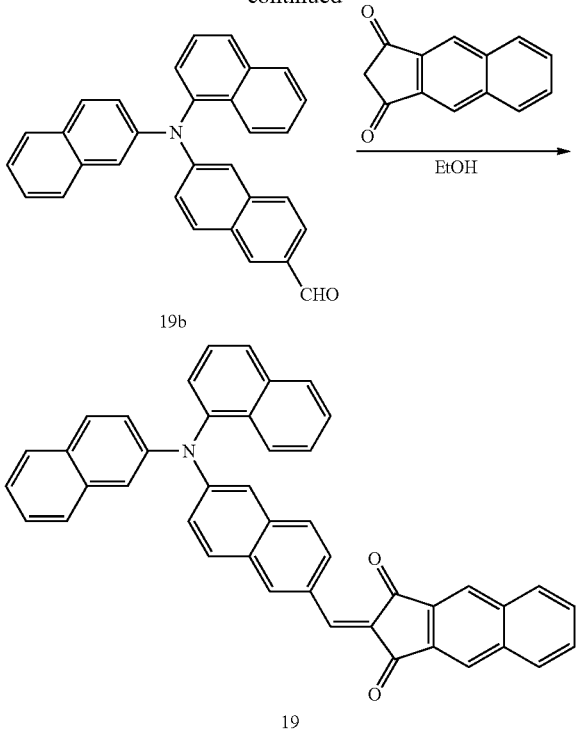

Synthesis of Compound 19a 5.0 Gram of 1,2'-dinaphthylamine (produced by Tokyo Chemical Industry Co., Ltd.), 4.1 g of methyl 6-bromo-2-naphthoate (produced by Wako Pure Chemical Industries, Ltd.), 174 mg of palladium acetate, 722 mg of BINAP (2,2'-bis(diphenylphosphino)-1,1'-binaphthyl) and 10.1 g of cesium carbonate were added to 50 ml of dehydrated xylene, and the mixture was refluxed for 4 hours. The resulting reaction mixture was suction-filtered and after distilling off the solvent by an evaporator, purified on a silica gel column (developing solvent: toluene) to obtain 6.1 g of Compound (19a).

Synthesis of Compound 19b 5.0 Ml of SMEAH (sodium bis(2-methoxyethoxy)aluminum hydride, a toluene solution (about 70%), produced by Wako Pure Chemical Industries, Ltd.) was added to 6 ml of dehydrated toluene and after adjusting the inner temperature to 0° C. on an ice bath, a solution obtained by dissolving 2.1 ml of 1-methylpiperazine in 4 ml of dehydrated toluene was added dropwise. Subsequently, 1.5 g of Compound (19a) was dissolved in 10 ml of dehydrated toluene and cooled on a dry ice bath to an inner temperature of −40° C., and the SMEAH toluene solution prepared above was added dropwise. The mixture was stirred for 4.5 hours, and concentrated hydrochloric acid was added until the pH became 1. Water and ethyl acetate were added thereto, and the oil layer was washed with an aqueous sodium hydrogencarbonate solution. The oil layer was dried over magnesium sulfate and then filtered, and the solvent was distilled off by an evaporator. The resulting reaction mixture was purified on a silica gel column and the solvent was removed by distillation to obtain 1.0 g of Compound (19b).

Synthesis of Compound 19

Compound 19 was synthesized in accordance with a known method (U.S. Patent Application Publication No. 2005/0065351) by using Compound 19b.

Identification of Compound 19

$^1$H NMR (CDCl$_3$) δ: 7.23-7.63 (12H, m), 7.67-7.75 (2H, m), 7.80 (2H, d), 7.85 (1H, d), 7.90 (1H, d), 7.96 (1H, d), 7.99 (1H, d), 8.09-8.14 (3H, m), 8.51 (2H, d), 8.57 (1H, d), 9.00 (1H, s).

(Fabrication of Device)

A solid-state imaging device was fabricated in the same manner as in Example 1 except for changing Compound 15 in the organic photoelectric conversion layer 12 to Compound 19.

Example 6

Synthesis of Compound 20

Compound 20 was synthesized in the same manner as in Example 5 except for changing 1,2'-dinaphthylamine to N-phenyl-2-naphthylamine (produced by Tokyo Chemical Industry Co., Ltd.).

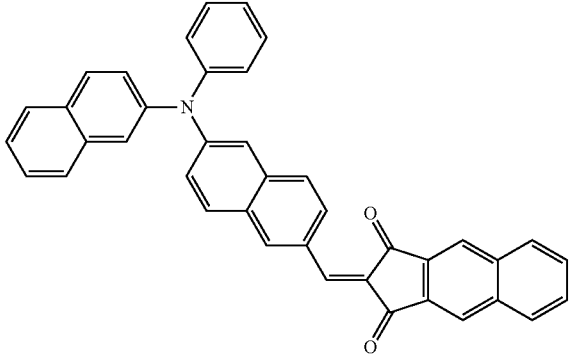

Identification of Compound 20

$^1$H NMR (CDCl$_3$) δ: 7.19 (1H, t), 7.25 (2H, d), 7.34-7.48 (7H, m), 7.58-7.73 (5H, m), 7.83 (2H, d), 7.88 (1H, d), 8.12 (3H, m), 8.52 (2H, m), 8.60 (1H, d), 9.01 (1H, s)

(Fabrication of Device)

A solid-state imaging device was fabricated in the same manner as in Example 1 except for changing Compound 15 in the organic photoelectric conversion layer 12 to Compound 20.

Example 7

Synthesis of Compound 121

Compound 121 was synthesized in accordance with a known method (*Synthesis*, 2004, 15, 2509, U.S. Patent Application Publication No. 2005/0065351).

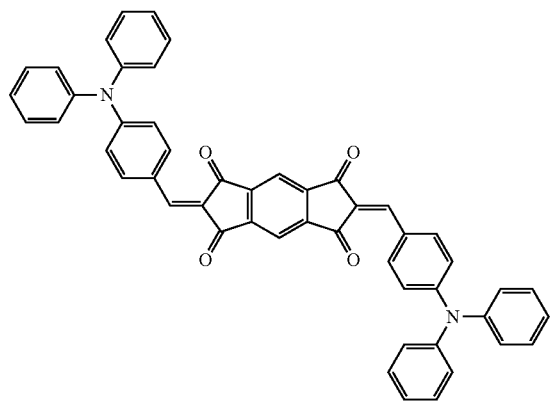

121

Identification of Compound 121

$^1$H NMR (CDCl$_3$) δ: 7.00 (4H, d), 7.25 (12H, m), 7.39 (8H, t), 7.86 (2H, s), 8.40 (2H, s), 8.47 (4H, d)

(Fabrication of Device)

A solid-state imaging device was fabricated in the same manner as in Example 1 except for changing Compound 15 in the organic photoelectric conversion layer 12 to Compound 121.

Example 8

Synthesis of Compound 122

Compound 122 was synthesized in accordance with a known method (*J. Mater. Chem.*, 2002, 12, 1671).

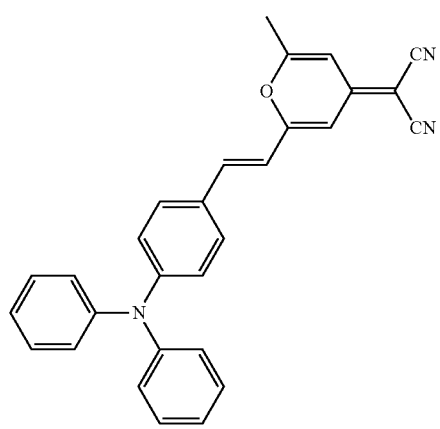

122

(Fabrication of Device)

A solid-state imaging device was fabricated in the same manner as in Example 1 except for changing Compound 15 in the organic photoelectric conversion layer 12 to Compound 122.

Example 9

The quinacridone indicated by Compound 123 was purchased from Tokyo Chemical Industry Co., Ltd.

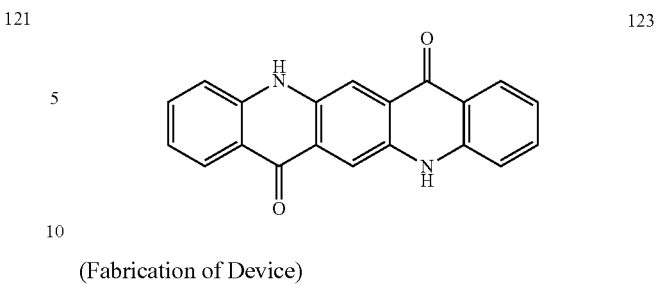

123

(Fabrication of Device)

A solid-state imaging device was fabricated in the same manner as in Example 1 except or changing Compound 15 in the organic photoelectric conversion layer 12 to Compound 123.

Example 10

(Fabrication of Device)

A solid-state imaging device was fabricated in the same manner as in Example 1 except for changing fullerene (C$_{60}$) in the organic photoelectric conversion layer 12 to fullerene (C$_{70}$).

Example 11

(Fabrication of Device)

A solid-state imaging device was fabricated in the same manner as in Example 4 except for changing fullerene (C$_{60}$) in the organic photoelectric conversion layer 12 to fullerene (C$_{70}$).

Comparative Examples 1 to 11

Solid-state imaging devices were fabricated in the same manner as in Examples 1 to 11 except for not irradiating white light of 1,000 lx.

Comparative Example 12

A solid-state imaging device was fabricated in the same manner as in Example 1 except for changing the organic photoelectric conversion layer 12 to a layer formed by depositing fullerene (C$_{60}$) alone to a thickness of 400 nm.

Comparative Example 13

A solid-state imaging device was fabricated in the same manner as in Example 1 except for changing the organic photoelectric conversion layer 12 to a layer formed by depositing Compound 15 alone to a thickness of 400 nm.

Comparative Example 14

A solid-state imaging device was fabricated in the same manner as in Example 1 except for changing the organic photoelectric conversion layer 12 to a layer formed by stacking a single layer of Compound 15 and a single layer of fullerene (C$_{60}$) each to have a thickness of 200 nm.

Comparative Example 15

A solid-state imaging device was fabricated in the same manner as in Example 1 except for changing the organic photoelectric conversion layer 12 to a layer formed by depositing fullerene (C$_{60}$) alone to a thickness of 200 nm, then polymerizing the fullerene ($C_{60}$) through light irradiation and further depositing Compound 15 to a thickness of 200 nm.

The external quantum efficiency (a relative value by taking the external quantum efficiency in Comparative Example 5 as 100) at the maximum sensitivity wavelength when an electric field of $2\times10^5$ V/cm was applied, is shown in Table 3.

TABLE 3

| | Compounds Used in Organic Photoelectric Conversion Layer | External Quantum Efficiency (relative value) (%) |
|---|---|---|
| Example 1 | Compound 15 and $C_{60}$ | 102 |
| Example 2 | Compound 16 and $C_{60}$ | 99 |
| Example 3 | Compound 17 and $C_{60}$ | 102 |
| Example 4 | Compound 18 and $C_{60}$ | 95 |
| Example 5 | Compound 19 and $C_{60}$ | 103 |
| Example 6 | Compound 20 and $C_{60}$ | 103 |
| Example 7 | Compound 121 and $C_{60}$ | 45 |
| Example 8 | Compound 122 and $C_{60}$ | 91 |
| Example 9 | Compound 123 and $C_{60}$ | 64 |
| Example 10 | Compound 15 and $C_{70}$ | 105 |
| Example 11 | Compound 18 and $C_{70}$ | 97 |
| Comparative Example 1 | Compound 15 and $C_{60}$ | 98 |
| Comparative Example 2 | Compound 16 and $C_{60}$ | 97 |
| Comparative Example 3 | Compound 17 and $C_{60}$ | 95 |
| Comparative Example 4 | Compound 18 and $C_{60}$ | 94 |
| Comparative Example 5 | Compound 19 and $C_{60}$ | 100 |
| Comparative Example 6 | Compound 20 and $C_{60}$ | 100 |
| Comparative Example 7 | Compound 121 and $C_{60}$ | 41 |
| Comparative Example 8 | Compound 122 and $C_{60}$ | 87 |
| Comparative Example 9 | Compound 123 and $C_{60}$ | 60 |
| Comparative Example 10 | Compound 15 and $C_{70}$ | 100 |
| Comparative Example 11 | Compound 18 and $C_{70}$ | 94 |
| Comparative Example 12 | $C_{60}$ | 32 |
| Comparative Example 13 | Compound 15 | 27 |
| Comparative Example 14 | Compound 15 and $C_{60}$ | 46 |
| Comparative Example 15 | Compound 15 and $C_{60}$ | 3 |

As seen from Table 3, in Examples 1 to 11, the external quantum efficiency (photoelectric conversion efficiency) is increased as compared with Comparative Examples 1 to 11. It is seen that the external quantum efficiency is greatly high, compared with Comparative Examples 12 to 15.

In Examples 1 to 11, white light of 1,000 lx was further irradiated for 168 hours after irradiating white light of 1,000 lx for 168 hours, it was found that the external quantum efficiency is not changed at all.

By irradiating white light for a fixed time after the fabrication of a solid-state imaging device, rise and fall in the sensitivity during use can be suppressed and the color tint can be kept constant.

Examples where the fullerene polymerization ratio in the organic photoelectric conversion layer was determined are described below. Incidentally, when a solid-state imaging device is fabricated, the fullerene polymerization ratio can be hardly determined. Therefore, the test was performed by forming a photoelectric conversion layer on a glass substrate.

Example 12

An electron blocking material (EB-3) shown above was deposited on a glass ITO substrate to a thickness of 100 nm, and a layer obtained by co-depositing Compound 15 and fullerene ($C_{60}$) in a ratio of 200 nm and 200 nm in terms of a single layer was deposited thereon by vacuum heating deposition to form a photoelectric conversion layer. Furthermore, an amorphous ITO layer was deposited as the upper electrode by sputtering to a thickness of 5 nm to form a transparent electrode, and a glass-made sealing layer was introduced on the upper electrode to obtain Glass Device 1. The "glass device" as used herein indicates the same solid-state imaging device as that of Example 1 except that a glass-made sealing layer was introduced in place of the protective layer (the SiO layer and the $Al_2O_3$ layer). Glass Device 1 was irradiated with white light of 1,000 lx (fluorescent lamp for color viewer, manufactured by Dai-Nippon Printing Co., Ltd.) for 20 hours to fabricate Glass Device 2 (corresponding to Example 1 in Table 3).

Example 13

Glass Device 3 was fabricated by further irradiating white light of 1,000 lx (fluorescent lamp for color viewer, manufactured by Dai-Nippon Printing Co., Ltd.) for 148 hours on Glass Device 2 fabricated in Example 12.

Example 14

Glass Device 4 was fabricated in the same manner as in Example 12 except for changing Compound 15 in the organic photoelectric conversion layer 12 to Compound 16 and changing the irradiation time of white light of 1,000 lx to 168 hours (corresponding to Example 2 in Table 3).

Example 15

Glass Device 5 was fabricated in the same manner as in Example 14 except for changing the ratio of Compound 16 and Fullerene ($C_{60}$) in the organic photoelectric conversion layer 12 to 67 nm and 333 nm in terms of a single layer.

Example 16

Glass Device 6 was fabricated in the same manner as in Example 15 except for changing the irradiation time of white light to 500 hours.

Example 17

Glass Device 7 was fabricated in the same manner as in Example 16 except for changing the ratio of Compound 16 and Fullerene ($C_{60}$) in the organic photoelectric conversion layer 12 to 40 nm and 360 nm in terms of a single layer.

Comparative Example 16

Glass Device 8 was fabricated in the same manner as in Example 12 except for not irradiating white light.

Comparative Example 17

Glass Device 9 was fabricated in the same manner as in Example 14 except for changing the organic photoelectric conversion layer 12 to a layer formed by depositing fullerene ($C_{60}$) alone to a thickness of 400 nm.

(Method for Estimating Amount of Fullerene Polymer Produced)

The glass sealing of these glass devices was removed, and the organic photoelectric conversion film was washed with toluene. It is generally known that the solubility of the fullerene polymer for toluene is very low, and while the organic photoelectric conversion dye and the fullerene were dissolved in the toluene solution, a fullerene polymer film remained on the substrate. The reduction of fullerene (=amount of fullerene polymer produced) was estimated from the absorption intensity in the absorption peak (335 nm) attributable to fullerene in the toluene solution. The results are shown in Table 4. The combined amount of the organic photoelectric conversion dye and the fullerene before light irradiation is assumed to be 100% (volume ratio). The external quantum efficiency is shown by a relative value to Glass Device 1 which is taken as 100.

TABLE 4

|  | Glass Device Used | External Quantum Efficiency (relative value) (%) | Amount of Fullerene Polymer Produced (%) | Residual Amount of Fullerene (%) |
|---|---|---|---|---|
| Example 12 | Glass Device 2 | 101 | 15 | 35 |
| Example 13 | Glass Device 3 | 102 | 27 | 23 |
| Example 14 | Glass Device 4 | 103 | 28 | 22 |
| Example 15 | Glass Device 5 | 103 | 55 | 28 |
| Example 16 | Glass Device 6 | 103 | 67 | 16 |
| Example 17 | Glass Device 7 | 101 | 74 | 16 |
| Comparative Example 16 | Glass Device 8 | 100 | 0 | 50 |
| Comparative Example 17 | Glass Device 9 | 30 | 97 | 3 |

It is seen from these results that a high external quantum efficiency can be obtained only when a photoelectric conversion dye, a fullerene and a fullerene polymer are appropriately mixed.

In Examples above, the test was performed on an imaging device, but the electron blocking layer is not concerned in the test and therefore, the same results are obtained also in the test on a photoelectric conversion device shown in FIG. 1A having no electron blocking layer.

Example 18

A solid-state imaging derive was fabricated in the same manner as in Example 1 except that after depositing the photoelectric conversion layer, a hole blocking layer was deposited by sputtering to a thickness of 50 Å to give a volume ratio of 2:1 between $CeO_2$ and $Ta_2O_5$. The external quantum efficiency at the same electric field intensity was the same as that in Example 1.

Example 19

A solid-state imaging device was fabricated in the same manner as in Example 5 except that after depositing the photoelectric conversion layer, a hole blocking layer was deposited by sputtering to a thickness of 50 Å to give a volume ratio of 2:1 between $CeO_2$ and $Ta_2O_5$. The external quantum efficiency at the same electric field intensity was the same as that in Example 5.

Comparative Example 18

A solid-state imaging device was fabricated in the same manner as in Example 18 except for not irradiating white light of 1,000 lx. The external quantum efficiency at the same electric field intensity was the same as that in Comparative Example 1.

Comparative Example 19

A solid-state imaging device was fabricated in the same manner as in Example 19 except for not irradiating white light of 1,000 lx. The external quantum efficiency at the same electric field intensity was the same as that in Comparative Example 5.

In Examples 18 and 19 and Comparative Examples 18 and 19, the dark current was reduced by 5 to 20% at the same electric field intensity, compared with Examples 1 and 5 and Comparative Examples 1 and 5, revealing that the dark current can be suppressed by the introduction of a hole blocking layer.

As described in the foregoing pages, the photoelectric conversion device according to an embodiment comprises, between a first electrode and a second electrode, a photoelectric conversion layer containing a mixture of an organic photoelectric conversion dye, a fullerene or a fullerene derivative, and a fullerene polymer.

In the photoelectric conversion device according to the embodiment, the photoelectric conversion layer is a bulk-heterostructure including an organic photoelectric conversion dye, a fullerene or a fullerene derivative, and a fullerene polymer.

In the photoelectric conversion device according to the embodiment, the volume ratio of the fullerene polymer in the photoelectric conversion layer is set to at least 10% by irradiating an electromagnetic wave or an electron beam on the photoelectric conversion layer of the photoelectric conversion device.

In the photoelectric conversion device according to the embodiment, the electromagnetic wave or electron beam is a visible ray.

The wavelength of the visible ray is from 400 to 700 nm.

In the photoelectric conversion device according to the embodiment, the fullerene polymer is contained in the photoelectric conversion layer in a volume ratio of 10 to 80%.

In the photoelectric conversion device according to the embodiment, a charge blocking layer is provided between the first or second electrode and the photoelectric conversion layer.

In the photoelectric conversion device according to the embodiment, the charge blocking layer is an electron blocking layer.

In the photoelectric conversion device according to the embodiment, the charge blocking layer is a hole blocking layer.

In the photoelectric conversion device according to the embodiment, an electron blocking layer is provided between the first electrode and the photoelectric conversion layer and at the same time, a hole blocking layer is provided between the second electrode and the photoelectric conversion layer.

In the photoelectric conversion device according to the embodiment, the organic photoelectric conversion dye is an arylidene compound.

In the photoelectric conversion device according to the embodiment, the organic photoelectric conversion dye is a compound represented by the following formula (I):

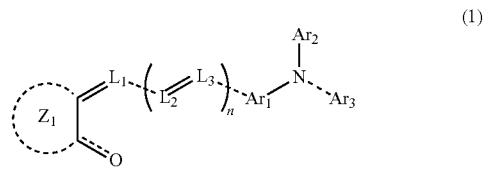

(1)

(wherein $Z_1$ is a ring containing two carbon atoms and represents a 5-membered ring, a 6-membered ring, or a condensed ring containing at least either a 5-membered ring or a 6-membered ring, each of $L_1$, $L_2$ and $L_3$ represents an unsubstituted methine group or a substituted methine group, n represents an integer of 0 or more, $Ar_1$ represents a divalent substituted arylene group, an unsubstituted arylene group, a substituted heteroarylene group or an unsubstituted heteroarylene group, and each of $Ar_2$ and $Ar_3$ independently represents a substituted aryl group, an unsubstituted aryl group, a substituted heteroaryl group or an unsubstituted heteroaryl group).

The photosensor according to an embodiment comprises the photoelectric conversion device described in any one above.

The imaging device according to an embodiment comprises the photoelectric conversion device described in any one above, wherein the first electrode includes a pixel electrode film divided into individual pixels.

The method for fabricating the photoelectric conversion device according to the embodiment comprises irradiating a photoelectric conversion device containing a mixed layer of the organic photoelectric conversion dye and the fullerene or fullerene derivative with a visible ray to contain the fullerene polymer.

The method for fabricating the photosensor according to the embodiment comprises irradiating a photoelectric conversion device containing a mixed layer of the organic photoelectric conversion dye and the fullerene or fullerene derivative with a visible ray to contain the fullerene polymer.

The method for fabricating the imaging device according to the embodiment comprises irradiating a photoelectric conversion device containing a mixed layer of the organic photoelectric conversion dye and the fullerene or fullerene derivative with a visible ray to contain the fullerene polymer.

In this way, according to the embodiments, a photoelectric conversion device and the like capable of maintaining a high photoelectric conversion efficiency for a long period of time can be obtained.

(Industrial Applicability)

The photoelectric conversion device and the imaging device of the present invention can obtain a high photoelectric conversion efficiency from the initial stage at the beginning of use and therefore, are useful in application as a solar cell or when mounting the imaging device in an imaging apparatus such as digital still camera, digital video camera, camera for cellular phones and camera for endoscopes.

Industrial Applicability

The present invention can provide a suitable photoelectric conversion device where a high photoelectric conversion efficiency can be obtained from the initial stage of operation and moreover, the photoelectric conversion efficiency can be maintained high for a long period of time.

The present application claims foreign priority based on Japanese Patent Application Nos. JP2010-41126 and JP2010-246871, filed Feb. 25 and Nov. 2, 2010, respectively, the contents of which is incorporated herein by reference.

REFERENCE SIGNS LIST

11, 101 Lower electrode (pixel electrode film)
12, 102 Photoelectric conversion layer
15, 104 Upper electrode (opposite electrode film)
16A Electron blocking layer
16B Hole blocking layer
100, 200, 300, 400 Imaging Device

The invention claimed is:

1. A photosensor comprising a photoelectric conversion device comprising: a first electrode, a second electrode, and a photoelectric conversion layer between the first and second electrodes, the photoelectric conversion layer containing a mixture of an organic photoelectric conversion dye, a fullerene or a fullerene derivative, and a fullerene polymer in which fullerenes are combined with each other via four membered ring, wherein the fullerene polymer is formed by irradiating the photoelectric conversion layer with visible rays having a wavelength of 400 to 700 nm, and the fullerene polymer is contained in the photoelectric conversion layer in a volume ratio of 10 to 80%.

2. The photosensor as claimed in claim 1, wherein the photoelectric conversion layer has a bulk-hetero structure containing the organic photoelectric conversion dye, the fullerene or the fullerene derivative, and the fullerene polymer.

3. The photosensor as claimed in claim 1, further comprising a charge blocking layer between the first or second electrode and the photoelectric conversion layer.

4. The photosensor as claimed in claim 3, wherein the charge blocking layer is an electron blocking layer.

5. The photosensor as claimed in claim 3, wherein the charge blocking layer is a hole blocking layer.

6. The photosensor as claimed in claim 1, further comprising: an electron blocking layer between the first electrode and the photoelectric conversion layer; and a hole blocking layer between the second electrode and the photoelectric conversion layer.

7. The photosensor as claimed in claim 1, wherein the organic photoelectric conversion dye is an arylidene compound.

8. The photosensor as claimed in claim 1, wherein the organic photoelectric conversion dye is a compound represented by formula (I):

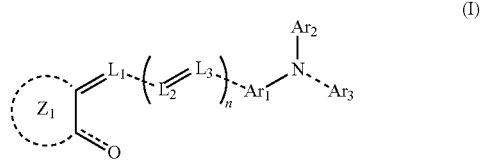

wherein $Z_1$ is a ring containing two carbon atoms and represents a 5-membered ring, a 6-membered ring, or a condensed ring containing at least one of a 5-membered ring and a 6-membered ring; $L_1$, $L_2$ and $L_3$ each independently represents an unsubstituted methine group or a substituted methine group; n represents an integer of 0 or more; $Ar_1$ represents a divalent group selected from the group consisting of a substituted arylene group, an unsubstituted arylene group, a substituted heteroarylene group, and an unsubstituted heteroarylene group; and $Ar_2$ and $Ar_3$ each independently represents a substituted aryl group, an unsubstituted aryl group, a substituted heteroaryl group or an unsubstituted heteroaryl group.

9. An imaging device comprising the photosensor claimed in claim 1, wherein the first electrode comprises a pixel electrode film divided into individual pixels.

10. A method for producing the photosensor claimed in claim 1, comprising irradiating a photoelectric conversion device containing a mixed layer of the organic photoelectric conversion dye and the fullerene or fullerene derivative with visible rays having a wavelength of 400 to 700 nm to contain the fullerene polymer.

11. A method for producing the imaging device claimed in claim 9, comprising irradiating a photoelectric conversion device containing a mixed layer of the organic photoelectric conversion dye and the fullerene or fullerene derivative with visible rays having a wavelength of 400 to 700 nm to contain the fullerene polymer.

12. A method for producing a photosensor comprising a photoelectric conversion device comprising: a first electrode, a second electrode, and a photoelectric conversion layer between the first and second electrodes, the photoelectric conversion layer containing a mixture of an organic photoelectric conversion dye, a fullerene or a fullerene derivative, and a fullerene polymer in which fullerenes are combined with each other via four-membered ring, wherein the fullerene polymer is formed by irradiating the photoelectric conversion layer with visible ray having a wavelength of 400 to 700 nm, and the fullerene polymer is contained in the photoelectric conversion layer in a volume ratio of 10 to 80%,
wherein the method comprises: irradiating a photoelectric conversion device comprising a mixed layer containing the organic photoelectric conversion dye and the fullerene or the fullerene derivative with visible ray having a wavelength of 400 to 700 nm so that the mixed layer contains the fullerene polymer to become the photoelectric conversion layer.

13. The method for producing a photosensor as claimed in claim 12, wherein the photoelectric conversion layer has a bulk-hetero structure containing the organic photoelectric conversion dye, the fullerene or the fullerene derivative, and the fullerene polymer.

14. The method for producing a photosensor as claimed in claim 12, wherein the photoelectric conversion device further comprises a charge blocking layer between the first or second electrode and the photoelectric conversion layer.

15. The method for producing a photosensor as claimed in claim 14, wherein the charge blocking layer is an electron blocking layer.

16. The method for producing a photosensor as claimed in claim 14, wherein the charge blocking layer is a hole blocking layer.

17. The method for producing a photosensor as claimed in claim 12, wherein the photosensor further comprises: an electron blocking layer between the first electrode and the photoelectric conversion layer; and a hole blocking layer between the second electrode and the photoelectric conversion layer.

18. The method for producing a photosensor as claimed in claim 12, wherein the organic photoelectric conversion dye is an arylidene compound.

19. The method for producing a photosensor as claimed in claim 12, wherein the organic photoelectric conversion dye is a compound represented by formula (I):

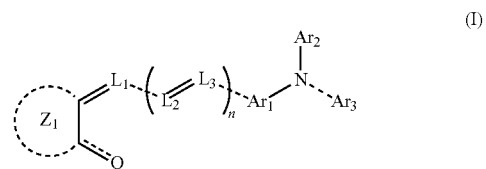

wherein $Z_1$ is a ring containing two carbon atoms and represents a 5-membered ring, a 6-membered ring, or a condensed ring containing at least one of a 5-membered ring and a 6-membered ring; $L_1$, $L_2$ and $L_3$ each independently represents an unsubstituted methine group or a substituted methine group; n represents an integer of 0 or more; $Ar_1$ represents a divalent group selected from the group consisting of a substituted arylene group, an unsubstituted arylene group, a substituted heteroarylene group, and an unsubstituted heteroarylene group; and $Ar_2$ and $Ar_3$ each independently represents a substituted aryl group, an unsubstituted aryl group, a substituted heteroaryl group or an unsubstituted heteroaryl group.

* * * * *